(12) United States Patent
Kanno et al.

(10) Patent No.: US 7,375,574 B2
(45) Date of Patent: *May 20, 2008

(54) SEMICONDUCTOR DEVICE

(75) Inventors: Yusuke Kanno, Hachioji (JP);
Hiroyuki Mizuno, Musashino (JP);
Kazumasa Yanagisawa, Kokobunji (JP)

(73) Assignee: Renesas Technology Corporation, Tokyo (JP)

( * ) Notice: Subject to any disclaimer, the term of this patent is extended or adjusted under 35 U.S.C. 154(b) by 84 days.

This patent is subject to a terminal disclaimer.

(21) Appl. No.: 11/202,279

(22) Filed: Aug. 12, 2005

(65) Prior Publication Data

US 2005/0285659 A1    Dec. 29, 2005

Related U.S. Application Data

(63) Continuation of application No. 10/757,593, filed on Jan. 15, 2004, now Pat. No. 6,985,022, which is a continuation of application No. 10/211,565, filed on Aug. 5, 2002, now Pat. No. 6,700,429.

(30) Foreign Application Priority Data

Aug. 31, 2001  (JP)  ............... 2001-262659
Jun. 6, 2002   (JP)  ............... 2002-165059

(51) Int. Cl.
*H03L 5/00*   (2006.01)

(52) U.S. Cl. ............... 327/333; 327/306; 327/315; 327/390; 327/391; 326/63; 326/68; 326/69; 326/80

(58) Field of Classification Search ........ 327/317–319, 327/321–322, 328, 333, 431, 430; 326/68, 326/80–81

See application file for complete search history.

(56) References Cited

U.S. PATENT DOCUMENTS

| 5,510,731 | A | * | 4/1996 | Dingwall ............... 326/63 |
| 5,559,464 | A | * | 9/1996 | Orii et al. ............. 327/333 |
| 5,834,948 | A |   | 11/1998 | Yoshizaki et al. ....... 326/81 |
| 5,889,420 | A | * | 3/1999 | Poechmueller .......... 327/108 |
| 6,300,796 | B1 |  | 10/2001 | Troutman et al. ........ 326/81 |

(Continued)

FOREIGN PATENT DOCUMENTS

JP    5-145400    11/1991

(Continued)

*Primary Examiner*—N. Drew Richards
*Assistant Examiner*—Hiep Nguyen
(74) *Attorney, Agent, or Firm*—Reed Smith LLP; Stanley P. Fisher, Esq.; Juan Carlos A. Marquez, Esq.

(57) ABSTRACT

A semiconductor device includes a differential level converter circuit that receives a first signal and outputs a second signal of greater amplitude. The differential level converter has a first MISFET pair for receiving the first signal, a second MISFET pair for enhancing the withstand voltage of the first MISFET pair, and a third MISFET pair with cross-coupled gates for latching the second signal from output. The film thickness of the gate insulating films of the second and third MISFET pairs is made thicker than that of the first MISFET pair, and the threshold voltages of the first and second MISFET pairs are made smaller than that of the third MISFET pair. This level converter circuit operates at high speed even if there is a large difference in the signal amplitude before and after level conversion.

15 Claims, 20 Drawing Sheets

U.S. PATENT DOCUMENTS

| | | | |
|---|---|---|---|
| 6,445,622 B1 | 9/2002 | Hirano | 365/189.11 |
| 6,504,400 B2 | 1/2003 | Tanaka et al. | 326/68 |
| 6,556,061 B1 * | 4/2003 | Chen et al. | 327/333 |
| 7,026,855 B2 * | 4/2006 | Sueoka et al. | 327/333 |
| 7,038,521 B2 * | 5/2006 | Cleary et al. | 327/333 |
| 7,102,410 B2 * | 9/2006 | Khan et al. | 327/333 |
| 2005/0270080 A1 * | 12/2005 | Kida et al. | 327/333 |

FOREIGN PATENT DOCUMENTS

| | | |
|---|---|---|
| JP | 5-315931 | 11/1991 |
| JP | 6-283979 | 3/1993 |
| JP | 9-74348 | 9/1995 |
| JP | 9-139663 | 11/1995 |
| JP | 10-84274 | 9/1996 |
| JP | 2000-163960 | 11/1998 |

\* cited by examiner

| | PMOS | NMOS | PMOS | NMOS |
|---|---|---|---|---|
| THICK-FILM MOS (HIGH WITHSTAND VOLTAGE) |  |  |  |  |
| THIN-FILM MOS (LOW WITHSTAND VOLTAGE) |  |  | ✕ | ✕ |
| | STANDARD THRESHOLD MOS | | LOW THRESHOLD MOS | |

SEMICONDUCTOR DEVICE

CROSS-REFERENCE TO RELATED APPLICATIONS

This application is a Continuation of nonprovisional U.S. application Ser. No. 10/757,593 filed Jan. 15, 2004, now U.S. Pat. No. 6,985,022 which is a Continuation of U.S. application Ser. No. 10/211,565 filed Aug. 5, 2002 now U.S. Pat. No. 6,700,429. Priority is claimed based on U.S. application Ser. No. 10/757,593 filed Jan. 15, 2004 which claims the priority of U.S. application Ser. No. 10/211,565 filed Aug. 5, 2002, which claims the priority of Japanese applications 2001-262659 and 2002-165059 filed on Aug. 31, 2001, and Jun. 6, 2002, respectively, all of which is incorporated by reference.

BACKGROUND OF THE INVENTION

1. Field of the Invention

The present invention relates to a level converter circuit that converts the amplitude of a signal in a semiconductor device and a semiconductor integrated circuit device.

2. Description of Related Art

The Documents cited herein and the numbers by which will be referred to be as follows: [Document 1] JP-A-283979/1994; [Document 2] JP-A-163960/2000; and [Document 3] JP-A-139663/1997.

FIG. 4 in Document 1 shows a conventional level converter circuit including a pair of P-channel MOSFETs Q7, Q8 with cross-coupled drains and gates and a pair of N-channel MOSFETs Q11, Q12 that receive complementary signals of reduced amplitude from an input at their gates. In addition, FIG. 1 in Document 1 shows an improved version of the level converter circuit of FIG. 4, which provides a pair of N-channel MOSFETs stages Q1, Q3 or Q2, Q4 to ensure an adequate withstand voltage.

FIG. 4(B) in Document 2 shows a level converter circuit including two P-channel MOSFET stages Q31, Q32 or Q33, Q34 and two N-channel MOSFET stages Q35, Q36 or Q37, Q38. The gates of Q35, Q37 are biased to a constant voltage at a VPERI potential. It is assumed that VPERI is the power supply potential of a circuit (LOG shown in FIG. 4) that operates with a smaller amplitude before level conversion. Q35 or Q37 limits the voltage applied between the drain and the source of Q36 or Q38 to VPERI. Similarly, Q32 or Q34 limits a voltage applied between the drain and the source of Q32 or Q33 to VDD-VPERI (VDD>VPERI).

FIG. 1 in Document 3 also shows a level converter circuit similar to the circuit (MOSFETs 14-17 and 19-22) shown in FIG. 4(B) in Document 2.

In a preliminary study of system-on-a-chip circuits, it was found that the internal operating voltages in existing circuits of this type are increasingly lowered in response to demands for smaller power consumption. On the other hand, external interfaces have to use the relatively high standard voltages. As such, signals must be converted across very large differences between power supply voltages. Under these circumstances, it is difficult for a conventional level converter circuit configured only with MOSFETs with high withstand voltages (that have been designed for power supply voltages for great-amplitude signals) to convert the signals. A prior art level converter circuit has difficulty in operation if the input signal voltage level becomes smaller than 1 V, such as VDD=0.75 V. This is mainly caused by a reduced difference between the threshold voltage of the input N-channel MOSFETs for driving a latch and the power supply voltage for an input signal, which makes it difficult for the input N-channel MOSFETs to operate. In addition, there is an urgent demand for system-on-a-chip circuits with lower power consumption. To meet this demand, it is important to lower the internal voltages of a system-on-a-chip circuit. However, lowering the internal operating voltage of a system-on-a-chip circuit leads to difficulties of sending and receiving signals to and from external circuits with relatively high standard voltages.

SUMMARY OF THE INVENTION

Accordingly, one object of the present invention is to achieve internal voltages smaller than 1 V without reducing external standard voltages and to provide a circuit that converts signal levels at a high speed.

In addition, substrate potentials of MOS circuits are generally controlled to lower power consumption of system LSI circuits. Lowered operating voltages of the internal control circuit, however, will make it difficult to control the substrate potentials.

Accordingly, another object of the present invention is to provide a level converter circuit that can convert a signal to one great amplitude for controlling substrates even if the operating voltages of the internal circuits are reduced.

One example of the present invention is described below. This means of the present invention provides a level converter circuit with MOSFETs having two different oxide film thicknesses (Tox) thereby having different withstand voltages. The invention uses a low-withstand-voltage MOSFET with a relatively thin gate insulating film as an input MOSFET for receiving small-amplitude signals, and a high withstand voltage MOSFET with a relatively thick gate insulating film as a withstand voltage enhancement MOSFET. The withstand voltage enhancement MOSFET has a relatively low threshold voltage.

In addition, to process signals of amplitudes as small as 1 V or less, it is preferable to provide a gate boosting circuit GBST that temporarily boosts the gate potential of the withstand voltage enhancement transistors in response to the input signal to assist the potential level conversion, and a level keeping circuit LKP that suppresses the potential of a node between the withstand-voltage-enhancement transistors and the input thin-film NMOS transistor to the withstand voltage of the input thin-film NMOS transistor. Furthermore, the increase of operating voltage range causes an unbalance between the rising and falling delay time. To avoid such an unbalance, it is preferable to add a transition detector circuit to the level converter circuit.

BRIEF DESCRIPTION OF THE DRAWINGS

The foregoing and additional features and characteristics of the present invention will become more apparent from the following detailed description considered with reference to the accompanying drawings in which like reference numerals designate like elements and wherein.

DETAILED DESCRIPTION OF THE PREFERRED EMBODIMENTS

Embodiments of the invention are described with reference to the attached drawings. Circuit elements included in each block diagram for these embodiments are formed on a single chip, such as a silicon single crystal, by using known CMOS (complementary MOS) transistor or other integrated circuit technology.

First Embodiment

Figure 1:
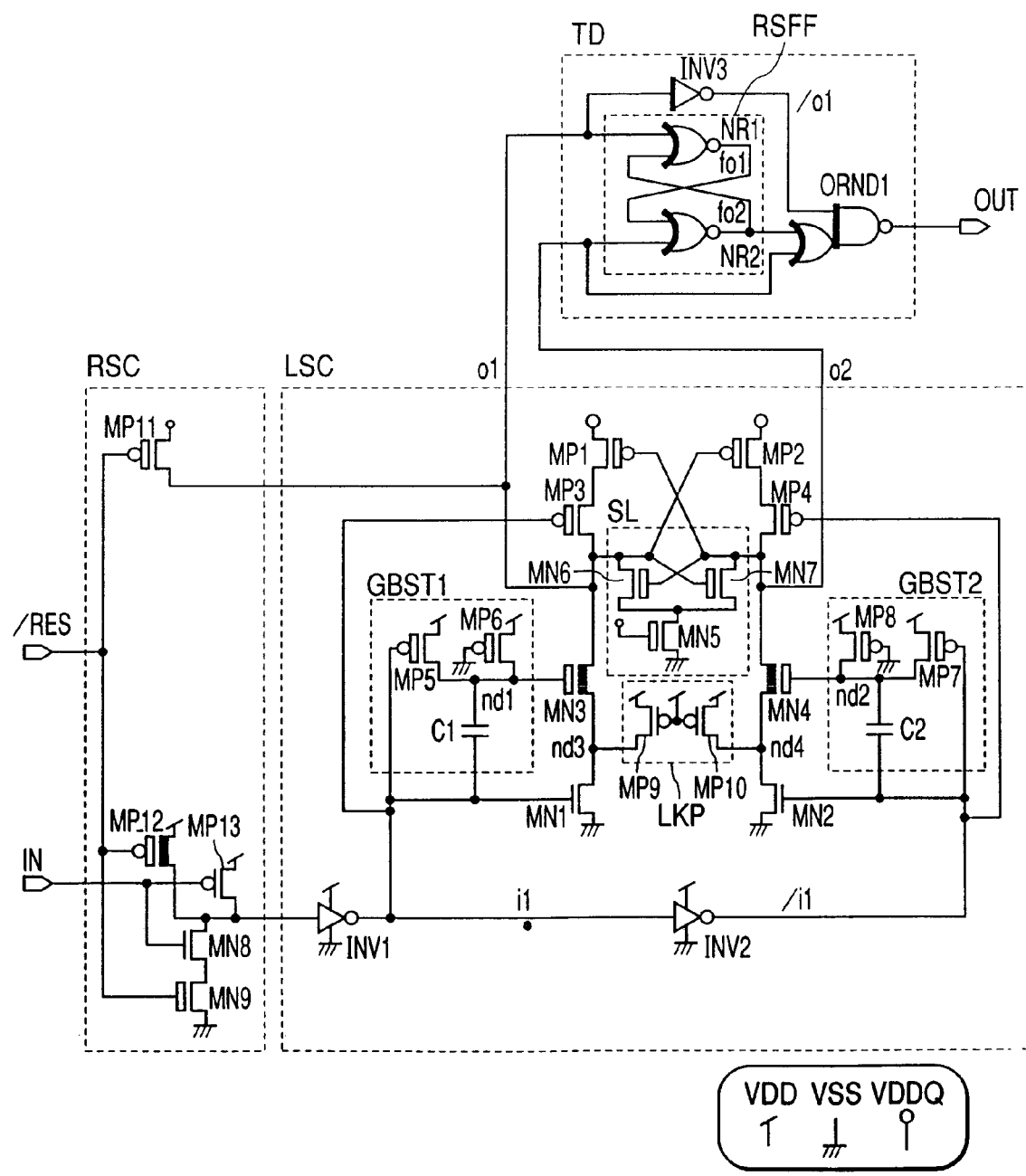
FIG. 1 shows a first embodiment of the present invention.

FIG. 1 shows a first embodiment of the present invention. The level converter circuit converts a signal with a small amplitude varying between 0 V and the VDD level (e.g., 0.75 V) to a signal with a large amplitude varying between 0 V and the VDDQ level (e.g., 3.3 V). The level converter circuit consists of three main parts: a level shifting circuit (LSC) for shifting a signal amplitude level, a reset circuit (RSC) for fixing an input signal level during power-on conditions, and a level transition detector (TD) for detecting a first-in-time level transition of differential outputs after the potential level conversion.

MOSFETs shown in this drawing are classified into three types based on gate oxide film thicknesses (Tox) and threshold voltages of the MOS transistors or six types if further considering electrical conducting types. The gate insulating film of a FET (field-effect transistor) used in the present invention is not limited to an oxide ($SiO_2$: silicon dioxide) film. A MISFET (metal insulator semiconductor field effect transistor) can also be used. In descriptions herein, the most typical transistor MOSFETs (metal oxide semiconductor field effect transistor) are used as examples (hereinafter "MOS").

Figure 2:
FIG. 2 is a table depicting MOSFET symbols used herein.
Figure 2:
Figure 2:
Figure 2:
Figure 2:
Figure 2:

In FIG. 2, a MOS with a thin-line gate symbol indicates a thin-gate-oxide-film MOS, and a MOS with a rectangular gate symbol indicates a thick-gate-oxide-film MOS (MOS with a thicker gate insulating film thickness). The thin-gate-oxide-film MOS has a large gate capacity and smaller threshold voltage such that it is smaller in size and capable of high-speed operation at smaller voltages. The thick-gate-oxide-film MOS is a high-withstand-voltage MOS, which can be used at higher power supply voltages. A MOS in which a channel part under the gate is depicted with a black rectangle indicates a MOS having a low threshold voltage (referred to as a "low-threshold MOS" hereinafter). A MOS in which a channel part under the gate is depicted with only a line indicates a MOS having a standard threshold voltage (referred to as a "standard-threshold MOS" hereinafter). One practical setting of the higher threshold voltage of a high-withstand-voltage MOS for each of P-channel and N-channel types is VTH1=0.75 V. One practical setting of the smaller threshold voltage of a high-withstand-voltage MOS for each of P-channel and N-channel types is VTH2=0.35 V. One practical setting of the threshold voltage of a thin-film MOS for each of P-channel and N-channel types is VTH3=0.35V. The actual threshold voltages the of PMOS and NMOS transistors may differ from each other due to manufacturing process variations, but being assumed the same for design purposes. In this embodiment, the oxide films of a high-withstand-voltage MOS and a high-withstand-voltage and low-threshold MOS for each of P-channel and N-channel types are formed in the same process. Therefore, these MOS transistors will have oxide films with the same film thickness (relatively thick). The threshold voltage of a high-withstand-voltage and low-threshold MOS is lowered with ion implantation by which impurity atoms of given types are introduced in the channel to obtain a given concentration. The channel implantation processing is performed separately for each group of MOS transistors with different withstand voltages and threshold voltages as depicted in FIG. 2. A high-withstand-voltage MOS of either a P-channel or an N-channel type is generally subject to channel implantation processing to set a desired threshold voltage. On the other hand, the oxide film of a thin-film MOS is formed in a process separated from the thick-film MOS forming process. A thin-film MOS is also generally subject to channel implantation processing to set a desired threshold voltage.

Referring back to FIG. 1, the level shifting circuit LSC will be described. The level shifting circuit LSC of the invention is characterized by a configuration of combinations of thick-oxide-film MOS transistors capable of withstanding higher voltages and thin-oxide-film MOS transistors capable of high-speed operation even at smaller voltages. PMOS transistors MP1 to MP8 and NMOS transistors MN3 to MN 7 are thick-oxide-film MOS transistors, and PMOS transistors MP9, MP10 and NMOS transistors MN1, and MN2 are thin-oxide-film MOS transistors. The level shifting circuit LSC forms a basic latch structure with PMOS transistors MP1, MP2 as loads, PMOS transistors MP3, MP4 for reducing the drain to source current during signal level conversion therein, input NMOS transistors MN1, MN2 for receiving small-amplitude input signals, and withstand-voltage-enhancement NMOS transistors MN3, MN4 for lowering the maximum voltage applied to MN1, MN2. The first characteristic of the present invention is the use of a low-threshold MOS as the withstand-voltage-enhancement MOS transistor. Furthermore, the second characteristic of the present invention is to provide a gate boosting circuit (GBST) for controlling voltages at the gates of the withstand-voltage-enhancement NMOS transistors MN3, MN4 with input signals such that signal amplitude levels can be converted even if the power supply voltages are low. This provides adequately lower ON resistance even if the amplitude of the power supply voltages of input signals is small. In addition, a level keeping circuit (LKP) and a slave latch (SL) are provided to prevent the drain voltage levels of the input NMOS transistors MN1, MN2 from being boosted to the higher voltage side due to leakage current of the withstand-voltage-enhancement NMOS transistors MN3, MN4. The level shifting circuit provides a function of inverting a latched high-amplitude signal in response to the transition of a low-amplitude input signal into an amplitude as small as 1 V or less. The level shifting circuit may be configured without using an inverter INV1, in which the drain of MP11 can be connected to o2, which is one of a complementary output pair. In this case, the basic operations are the same as in the circuit with the inverter INV1, except that logics of the complementary output pair o1 and o2 and an input IN of the level shifting circuit differ from those in the embodiment described above.

The GBST, which will be described in detail later, has a function of boosting the voltage at a node nd1 from the VDD level to the VDD+VD level. The value of a boosting voltage VD can enable a withstand-voltage-enhancement MOS to adequately switch "on", in a given period of time on level conversion. The level keeping circuit LKP includes thin-film PMOS transistors MP9, MP10, which are normally in the "off" state because VDD is always applied to their gates. This prevents the voltages at nodes nd1 and nd2 from exceeding the withstand voltages of the input NMOS transistors MN1, MN2 due to leakage currents caused in the withstand voltage enhancement NMOS transistors MN3, MN44. Therefore, the voltages at nodes nd3, nd4, if the threshold of a PMOS is VTH, are VDD+VTH at most.

The details of an embodiment of the GBST circuit is described below. GBST1 includes a capacitive element C1, a pull-up PMOS transistor MP6, and a PMOS transistor MP5 connected to an input signal. This capacitive element may be formed with an N MOS or another applicable transistor. It is preferable to use a low-threshold NMOS transistor. In this embodiment, since the gate of the PMOS transistor MP5 is driven by an input signal, when the input signal transits from the VSS level (0 V) to the VDD level, MP5 enters the "off" state thereby preventing boosting level at the node nd1 from reducing. MP6 has a gate voltage that is constantly at the VSS level (in the "on" state). MP6 has a function of keeping the voltage at the node nd1 at the VDD level during power-on conditions or when an input signal stays in the same state over an extended time period. Therefore, MP6 is indispensable. While MP5 is optional, which can be added to obtain higher boosting voltages so as to enhance the performance. When using MP6, MP5, it is effective if the gate width W of MP6 is made smaller than that of MP5.

Figure 3:
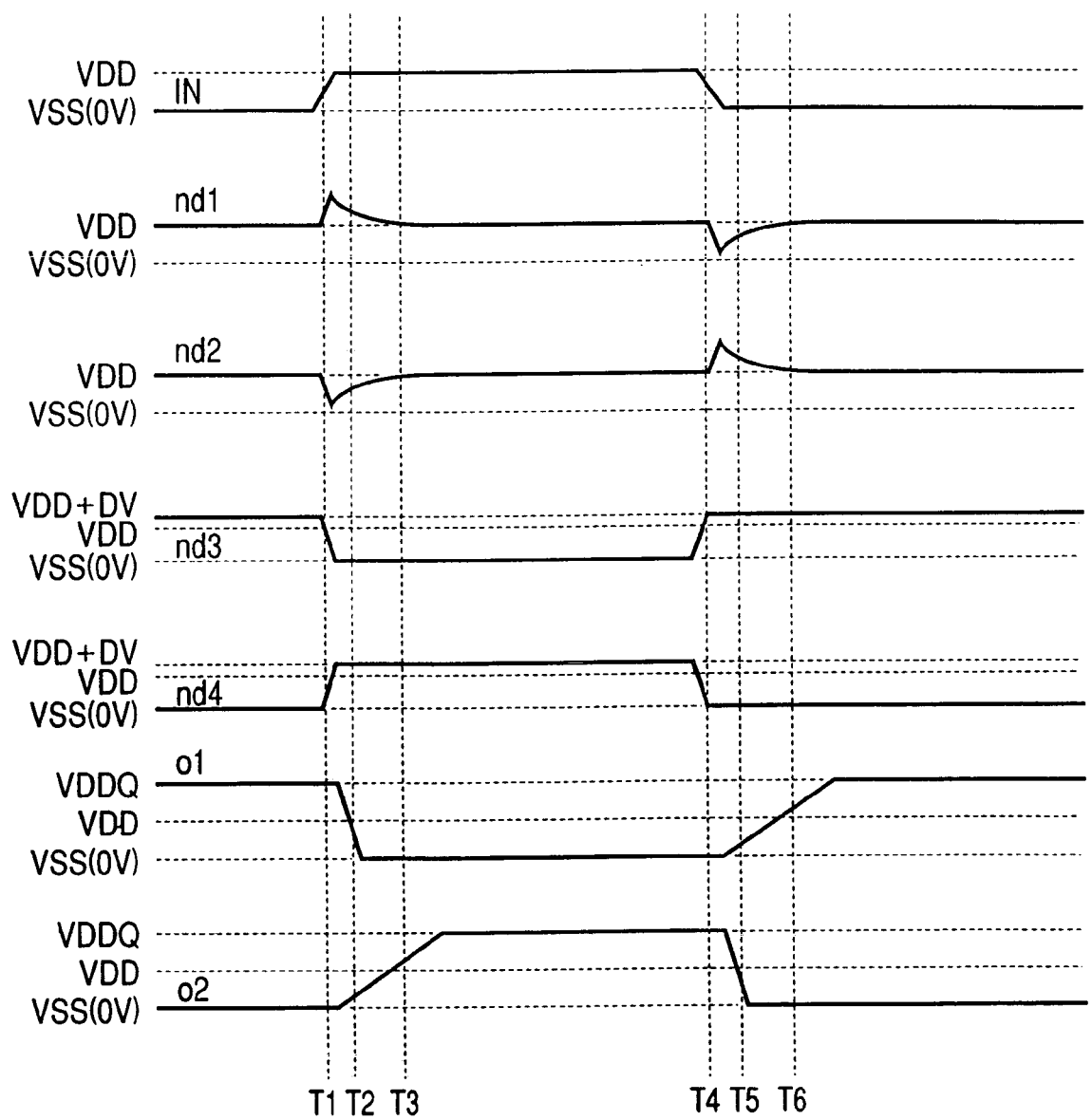
FIG. 3 shows the operating waveforms at major nodes in the first embodiment.

FIG. 3 shows the operating waveforms at major nodes in the level shifting circuit. During the operating cycles of the waveforms, /RES shown in FIG. 1 is assumed to be kept at a high level (VDDQ=3.3 V). First, operations during the voltage of an input signal changes from the VSS level (0 V) to the VDD level is described. At this time, MP6 is in the "on" state because its gate voltage is always kept at the VSS level (0 V), and the voltage at the node nd1 stays at the VDD level. If the voltage of input IN changes from the VSS level (0 V) to the high level (VDD, such as 1 V), the input NMOS transistor MN1 switches "on" and the voltage of the gate nd1 of the withstand-voltage-enhancement NMOS transistor MN3 (that has been pre-charged to the VDD level) is boosted to the VDD+DV level. In this case, the value of DV is determined according to factors including the capacitance of the capacitive element C1 and the parasitic capacitance of a MOS transistor connected to C1. When the voltage of the gate of the withstand-voltage-enhancement MOS is boosted to VDD+DV, the withstand-voltage-enhancement MOS transistor switches "on" more firmly, thus a voltage at the output node o1 is lowered to the VSS level. Simultaneously, a voltage at the node nd3 between the withstand-voltage-enhancement NMOS transistor MN3 and the input NMOS transistor MN1 is lowered from the VDD+VTH level to 0 V. In parallel to the series of these operations, at the other differential input pair, the input amplitude changes from the VDD level to the VSS level (0 V), and the input NMOS transistor MN2 switches "off". In response to this change, the voltage at the gate of the withstand-voltage-enhancement NMOS transistor MN4 returns to the VDD level. At this time, capacitive coupling causes the voltage at the gate of the withstand-voltage-enhancement NMOS transistor MN4 to be lowered for a very short period of time (ex. ns) below the VDD level, which causes the withstand-voltage-enhancement NMOS transistor MN4 to switch "off" more firmly, and simultaneously causes the input NMOS transistor MN2 to switch "off". When each of the withstand-voltage-enhancement NMOS transistor MN4 and the input NMOS transistor MN2 switches "off", the node nd4 enters the high-resistance state. At this time, since a smaller threshold voltage of the withstand-voltage-enhancement MOS transistor increases leakage current during "off" time, a voltage at the node nd4 may gradually be boosted to the VDDQ level. However, a PMOS transistor in the level keeping circuit LKP eventually keeps the voltage at the VDD+VTH level such that the maximum applicable voltage to the input thin-film NMOS transistor is limited to the VDD+VTH level at most. Therefore, the input NMOS transistor MN2 switches "off" and an NMOS transistor MN1 on the differential input pair side switches "on" such that the voltage at the output node o2 is gradually boosted to the high voltage (VDDQ, such as 3.3 V) level.

Next, the operations when the voltage of an input signal changes from the VDD level to the VSS level (0 V) are described. At this time, since a voltage at the gate of MP6 is constantly kept at the VDD level, MP6 is always in the "on" state, and a voltage at the node nd1 stays at the VSS level. When the voltage of the input signal changes from the VDD level to the VSS level at time T1, the input NMOS transistor MN2 switches "on", and simultaneously, the voltage of the gate nd2 of the withstand-voltage-enhancement NMOS transistor MN4 (that has been pre-charged to the VDD level) is boosted to the VDD+DV level. The value of DV is determined according to factors including the capacitance of a capacitive element C2 and the parasitic capacitance of a MOS transistor connected to C2. When the voltage of the gate of the withstand-voltage-enhancement MOS transistor is boosted to the VDD+DV level, the withstand-voltage-enhancement MOS transistor switches "on" more firmly such that the voltage at the output node o2 is lowered to the VSS level. Simultaneously, the voltage at a node nd4 between the withstand-voltage-enhancement NMOS transistor MN4 and the input NMOS transistor MN2 is lowered from the VDD+VTH level to 0 V. In parallel to the series of these operations, at the other differential input pair, the input amplitude changes from the VDD level to the VSS level (0 V), and the input NMOS transistor MN1 switches "off". In response to this change, the voltage at the gate of the withstand-voltage-enhancement NMOS transistor MN3 returns to the VDD level. At this time, capacitive coupling causes the voltage at the gate of the withstand-voltage-enhancement NMOS transistor MN3 to be lowered for a very short period of time below the VDD level, which causes the withstand-voltage-enhancement NMOS transistor MN3 to switch "off" more firmly, and simultaneously causes the input NMOS transistor MN1 to switch "off". When each of the withstand-voltage-enhancement transistor NMOS MN3 and the input NMOS transistor MN1 switches off, the node nd3 enters the high-resistance state. At this time, since the smaller threshold voltage of the withstand-voltage-enhancement MOS transistor increases its leakage current during "off" time, a voltage at the node nd3 may gradually be boosted to the VDDQ level. However, since the PMOS transistor in the level keeping circuit LKP eventually keeps the voltage at the VDD+VTH level such that the maximum applicable voltage to the input thin-film NMOS transistor is limited to the VDD+VTH level at most. And the voltage is preferred to increase gradually (with a slow inclination). Therefore, the input NMOS transistor MN1 switches "off" and the NMOS transistor MN1 on the differential input pair side switches "on", which causes a voltage at the output node o2 to be gradually boosted to the high voltage (VDDQ, such as 3.3 V) level.

This embodiment is characterized by the use of the capacitive elements C1 and C2 to boost the gate voltage of the withstand-voltage-enhancement MOS transistors MN3, MN4. In the case of an extremely low VDD power supply voltage, such as 0.75 V, if the slope of an input waveform becomes flatter, adequate boosting effects may not be obtained. This problem can be easily avoided through designing consideration of the maximum slope of the input signal waveform in input signal logic synthesis, or by incorporating one or several-stages of inverters in the input stage to make the change in the input signal waveform steeper.

As described, this embodiment uses a low-threshold MOS transistor as a withstand-voltage-enhancement MOS transistor to enable high-speed level conversion even with smaller setting value of the VDD power supply voltage, such as 1 V or less. Since the low-threshold MOS transistor can be substituted by a MOS transistor to implement an analog circuit in a system-on-a-chip circuit, it is not necessary to manufacture MOS transistors specifically designed for the level converter circuit. A system-on-a-chip circuit including analog circuits of the present invention requires no special MOS transistors for the level converter circuit. Therefore, this embodiment reduces the process cost.

In this embodiment, if the capacitive elements C1 and C2 are formed with NMOS transistors and their gate oxide films are made of high-dielectric constant material (referred to as "High-k material" hereinafter), the same capacitance can be obtained in a smaller area. The High-k material includes alumina ($Al_2O_3$), zirconium dioxide ($ZrO_2$), and hafnium dioxide ($HfO_2$). The thickness of a gate insulating film using High-k material can be made thicker than with the $SiO_2$ oxide film to achieve an identical capacitance. Therefore, reduces tunnel leakage current to the gate electrode. Furthermore, it substitutes the gate oxide films of the input NMOS transistors MN1 and MN2. When the voltage amplitude of an input signal is low and the voltage amplitude of an output signal is high so as to make MN1, MN2 larger than MP1 and MP2, while reducing the gate oxide film thickness to some extent which leads to a significant increase in gate leakage current.

The aforementioned embodiment is characterized by the use of a low-threshold MOS transistor as a withstand-voltage-enhancement MOS transistor. However, if the power supply voltage of an input signal is not so low, such as VDD=1.2 V, a standard-threshold MOS transistor may be used as the withstand-voltage-enhancement MOS transistor. This eliminates the need for introducing a low-threshold MOS transistor thereby preventing increasing the process cost.

The present invention aims to provide a circuit operating even with the power supply voltage of an output signal is four or more times that of an input signal. For example, the power supply VDD voltage of an input signal is less than 1 V or as low as 0.75 V and the power supply VDDQ voltage of the output signal is as high as 3.3 V. For that purpose, a small PMOS load transistor and a large input NMOS transistor are provided. However, the unbalance between the sizes of the PMOS load transistor and the NMOS input transistor may cause large differences in the output waveforms at the rising and falling edges of the complementary outputs o1 and o2 in the level shifting circuit, as shown in FIG. 3, according to the input and output signal voltage conditions. Therefore, even if the available voltage range may be widened, operating speed must be limited in accordance with the slower rising speed of the waveform such that entire circuit operation speed may be reduced. For this reason, the present invention is also characterized by adding a level transition detector TD to the differential output pair o1 and o2, for causing an output waveform to vary in accordance with the waveform of an earlier converted signal.

The level transition detector TD includes a flip-flop RSFF consisting of NOR gates NR1, NR2, an inverter INV3, and a composite gate ORND1. These circuits include MOS transistors depicted with symbols having thick line input parts, which indicates that the MOS transistors constituting each of the circuits are all high-withstand-voltage MOS transistors. The power supply of this circuit is connected to VDDQ (e.g., 3.3 V) and a ground potential VSS power supply corresponding to the VDDQ.

Interconnection among these devices is described with reference to FIG. 1. The reset terminal of RSFF is connected to the output o1 of the level shifting circuit, and the set terminal is connected to the output o2 of the level shifting circuit. The output o1 is further input to the inverter INV3. The output fo2 is input together with the output o2 to the OR part of the composite gate which includes more than one logic functions; an output /o1 of INV3 and an output of the OR part of the composite gate are input to the NAND gate.

Figure 6:
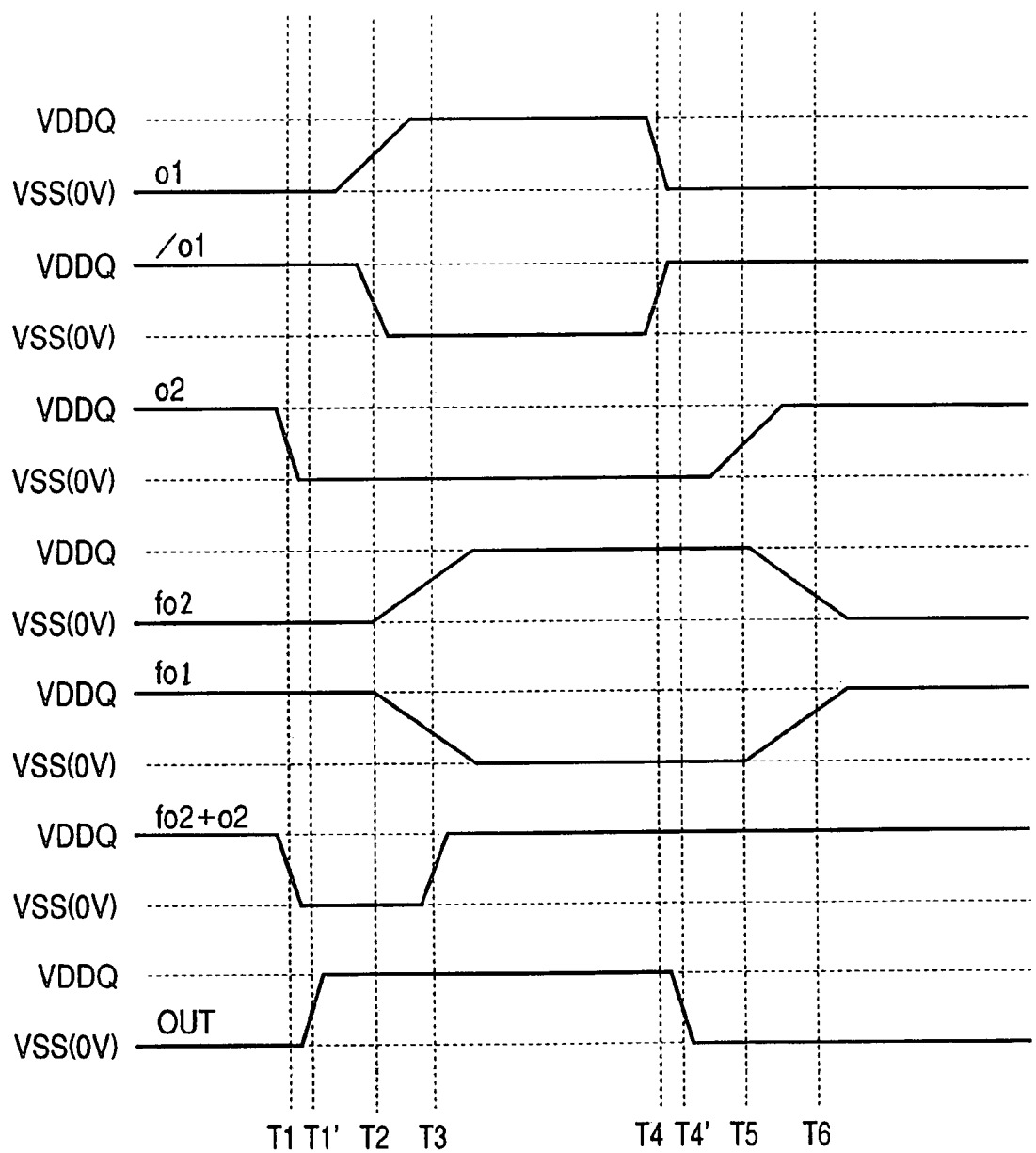
FIG. 6 shows operating waveforms of the level transit detector circuit shown in FIG. 1.

FIG. 6 shows the operating waveforms of the level transition detector TD. As described, the differential output pair o1 and o2 in the level shifting circuit of the present invention may have a long rising edge and a short falling edge when the range of converting voltage is widened. The level transition detector TD has a basic function of detecting an earlier changing signal or a signal at the falling edge (in this case), and transmitting it to the following state. The differential output pair o1 and o2 have short falling edges and long rising edges such that they cannot turn to the VDDQ level at the same time. Therefore, the outputs o1 and o2 are input to the RS flip-flop (RSFF), which causes the RS flip-flop to operate as a memory for recording that the level conversion has been made. It is important for the RSFF memory to operate. The operating speed may be set to smaller values. First, a case in which the output o1 transits from the VSS level (0 V) to the VDDQ level, and the output o2 transits from the VDDQ level to the VSS level (0 V). When the output o2 transits to the VSS level (0 V), the output of RSFF remains unchanged, fo1 stays at the VSS level (0 V), and fo2 stays at the VDDQ level. At this time, if the output fo2 of the RSFF and an output o2 of the differential input pair are operated with an OR, it is recognized that the output o2 has changed to the VSS level (0 V). Furthermore, when the result and the inverted output /o1 on the other side o1 of the differential input pair are operated with an NAND, the output changes to the VDDQ level which reflects the OR operation of the outputs fo2 of the RSFF and the output o2 of the differential input pair. Thereafter, when o1 changes to the VDDQ level, the output of the RSFF changes, and the OR operation of fo2 and o2 becomes the VDDQ level. However, the NAND operation of the result of the OR operation (of fo2 and o2) and /o1 remains unchanged. Next, a case in which o1 changes from the VDDQ level to the VSS level, and o2 changes from the VSS level to the VDDQ level will be described. When o1 changes to the VSS level, the inverted output /o1 changes to the VDDQ level, and the NOR operation of /o1 and the result of the OR operation of fo2 and o2 becomes the VSS level. After that, when o2 becomes the VDDQ level, the output of the RSFF changes, but the OR operation of fo2 and o2 and the result of said NOR operation remain unchanged. The converting time depends on the falling duration of o2 and the rising duration of /o1. As described above, since the level transition detector (or the shaping circuit) TD detects one of the differential outputs that first changes to the VSS level and then transmits the logic conversion to the following stage, it provides high-speed signal transmission.

Regarding the input from the level shifting circuit LSC to the level transition detector TD, the description above has been made based on a case that o1 and o2 (the complementary output pair of the LSC) are input to NR1 and INV3 as well as NR2 and the composite gates, respectively. However, in another embodiment, o2 and 01 (the complementary output pair of the LSC) are input to NR1 and INV3 as well as to NR2 and the composite gate, respectively, which provides the same basic operations as the aforementioned embodiment, except for the output values.

Figure 7:
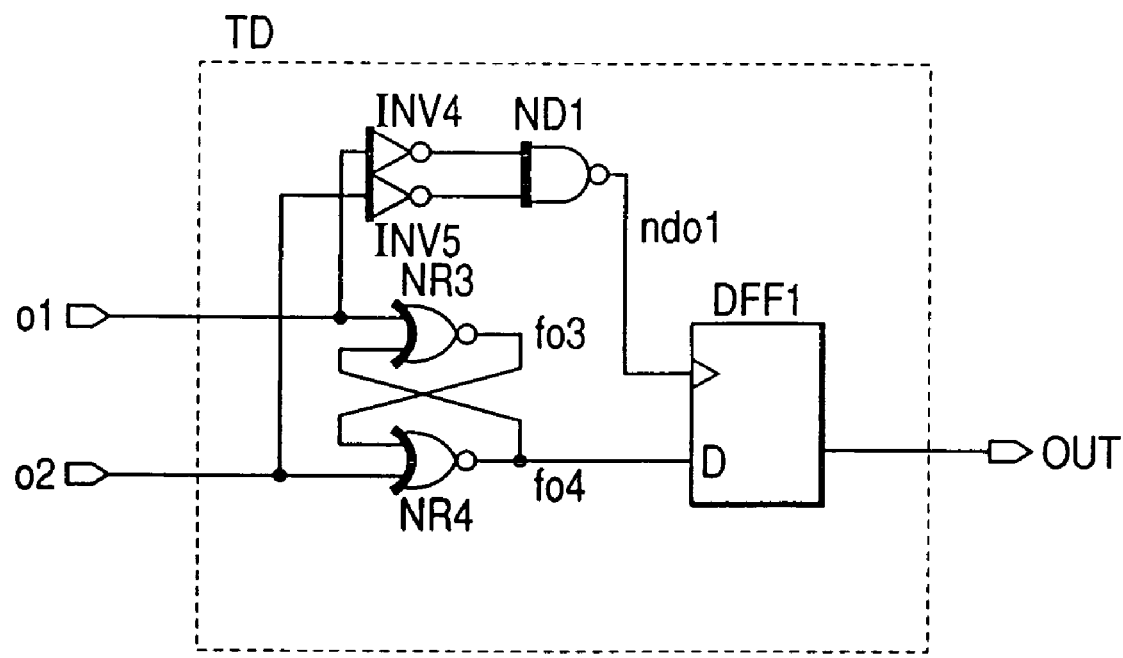
FIG. 7 shows another embodiment of the level transit detector circuit.

FIG. 7 is a drawing showing a second embodiment of the level transition detector TD. This circuit includes an RS flip-flop RSFF including logic NOR gates NR3, NR4, inverters INV4, INV5, a NAND gate ND1, and a clock-trigger D-type flip-flop DFF1. A differential output pair o1, o2 from the level shifting circuit are input to the RSFF and the inverters INV4, INV5 at the same time. Both outputs of INV4, INV5 are input to ND1. The output of ND1 is input to the clock terminal of DFF1. On the other hand, the output of the RS flip-flop is input to the D terminal of DFF1. This circuit generates triggers in response to changes in levels of the differential output pair, and outputs values that have been held in the RSFF.

Figure 8:
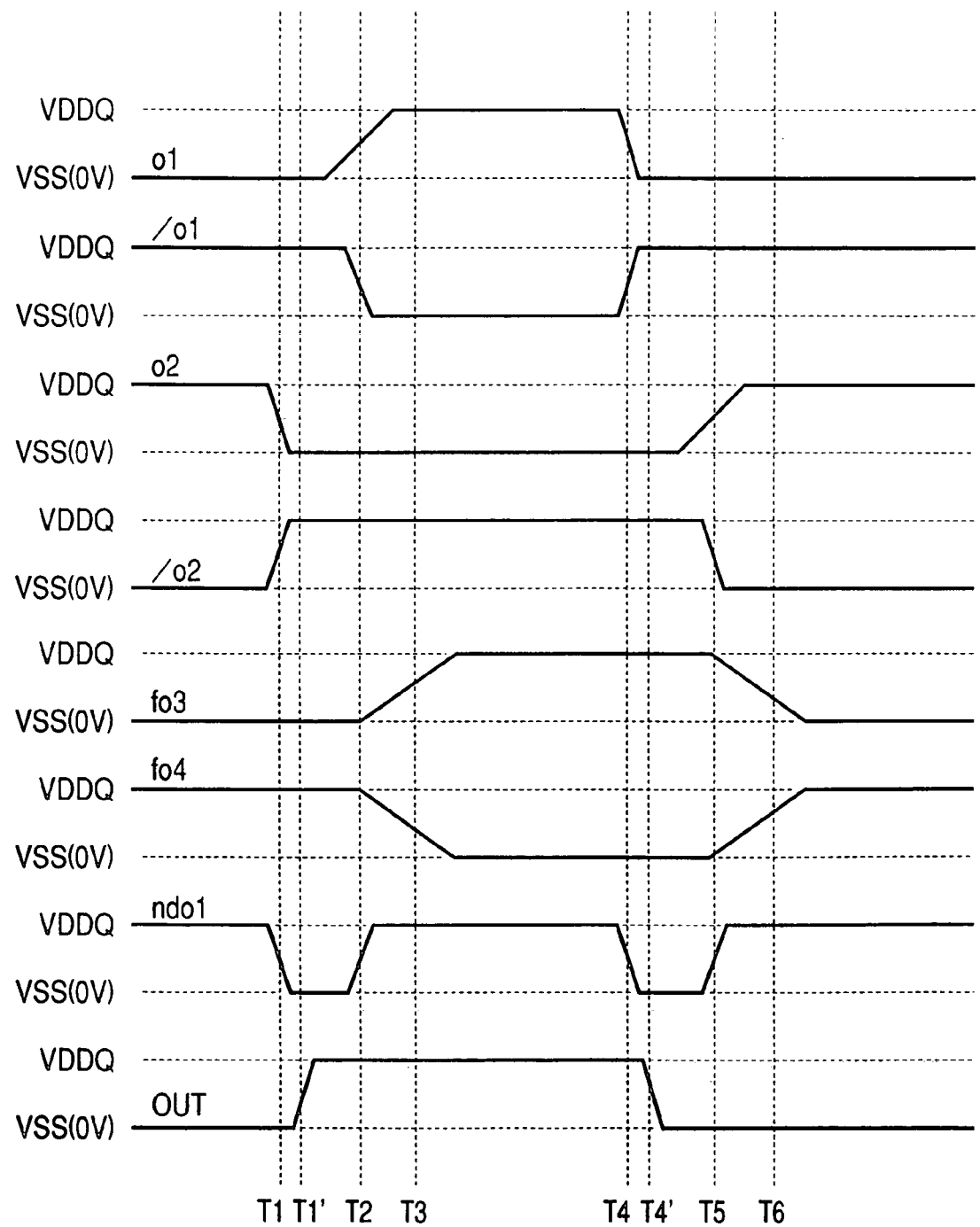
FIG. 8 shows the operating waveforms of the level transit detector circuit shown in FIG. 7.

FIG. 8 shows the operating waveforms of the level transition detector TD in FIG. 7. First, the operations when o1 changes from the VSS level to the VDDQ level, and o2 changes from the VDDQ level to the VSS level will be described. Of the differential output pair o1, o2, o2 has a shorter transition time such that both o1 and o2 may become the VSS level simultaneously. At this time, the RSFF continues to hold the original values, i.e., fo3 stays at the VSS level and fo4 stays at the VDDQ level. After that, o1 changes from the VSS level to the VDDQ level, and, in response to this change, the RSFF changes fo3 and fo4 to the VDDQ level and the VSS level, respectively. At this time, if the inverted logics of the differential output pair o1, o2 are input to the NAND gate ND1, the output ndo1 of ND1 becomes the VSS level only when both o1 and o2 are at the VSS level. As such, the falling edge of this signal can be used as a trigger signal indicating when the level conversion in the level shifting circuit. If this signal is input to the clock terminal of DFF1 and the output of the RSFF is input to the D terminal of DFF1, DFF1 outputs a signal in the state held in the RSFF or the VDDQ level.

Alternatively, a case in which o1 changes from the VDDQ level to the VSS level and o2 changes from the VSS level to the VDDQ level will be described. Of the differential output pair o1, o2, o1 has a shorter transition time such that both o1 and o2 may become the VSS level simultaneously. At this time, the RSFF continues to hold the original values, i.e., fo3 stays at the VDDQ level and fo4 stays at the VSS level. Thereafter, o2 changes from the VSS level to the VDDQ level, and, in response to this change, the RSFF changes fo3 and fo4 to the VSS level and the VDDQ level, respectively. At this time, if the inverted logics of the differential output pair o1, o2 are input to the NAND gate ND1, the output ndo1 of ND1 becomes the VSS level only when both o1 and o2 are at the VSS level. As such, the falling edge of this signal can be used as a trigger signal indicating the level conversion in the level shifting circuit. If this signal is input to the clock terminal of DFF1 and the output of the RSFF is input to the D terminal of DFF1, DFF1 outputs a signal in the state held in the RSFF or the VSS level.

Regarding the input from the level shifting circuit LSC to the level transition detector TD, the description above has been made based on a case that the LSC complementary outputs o1, o2 are input to NR3 as well as INV4 and to NR4 and INV5, respectively. In another embodiment, o2 and o1 (the complementary output pair of LSC) are input to NR3 and INV4 as well as to NR4 and INV5, respectively, which provides the same basic operation as the aforementioned embodiment, except for the output values.

Furthermore, the level converter circuit of the present invention provides a level keeping function during power-on with a reset circuit RSC. When the power supply voltage VDD is applied prior to VDDQ, no persistent through current (that is a concern at power-on) is generated, since the power supply voltage VDDQ is applied to the level shift block (in broken line) while the input of the level shifting circuit being in the fixed state. On the other hand, if VDDQ is applied prior to VDD, the latch is powered up while the input of the level shift block remaining unfixed such that the persistent through current may be generated until VDD is applied. To avoid such a situation, the level converter circuit is provided with a slave latch SL in the level shifting circuit LSC and a reset circuit RSC at its input for preventing through currents from being generated.

First, the slave latch SL will be described. As shown in FIG. 1, the slave latch SL added to the level shift block includes thick-film NMOS transistors MN6, MN7, and MN5. The NMOS transistor MN5 is provided to suppress current of the slave latch. The interconnection among these MOS transistors is described below. The gate of MN5 is connected to the VDDQ power supply, the drain of MN5 is connected to the sources of MN6 and MN7, and the source of MN5 is connected to the VSS power supply. The gate of MN6 is connected to the gate of MP1 and the drain of MN7, and the gate of MN7 is connected to the gate of MP2 and the drain of MN6. The sources of MN6 and MN7 are both connected to the drain of MN5.

Next, the reset circuit RSC is described as follows. The reset circuit RSC is designed to fix the input to the level shifting circuit with a reset signal /RES and to fix the latch of the level shifting circuit according to the fixed input value. The RSC includes a NAND gate composed of PMOS transistors MP12, MP13 and NMOS transistors MN8, MN9 (for fixing an input signal to the level shifting circuit with a reset signal), and a PMOS transistor MP11 (for changing the voltage at the node o1 to the VDDQ level according to this input value). The reset signal is required to have a VDDQ amplitude for controlling the level shifting circuit. In other words, a signal of the VDD amplitude needs to be converted to the VDDQ level for the on/off control of the gate of MP11. Thereafter, a MOS transistor receives a reset signal /RES with an amplitude of VDDQ. For MP12, which has VDS as low as VDD, it can be a low-threshold MOS transistor as described above.

The reset signal /RES is at the VSS level (0 V) when the level converter circuit is in the non-operating state, and it changes to the VDDQ level to set the level converter circuit in operation. When /RES is at the VSS level (0 V), the output of the NAND gate composed of the PMOS transistors MP12, MP13 and the NMOS transistors MN8, MN9 is always at the VDD level regardless of the value of the input signal IN. At this time, i1 and /i1 change to the VSS level (0 V) and VDD level, respectively, and the output nodes o1 and o2 of the level shifting circuit change to the VDDQ level and the VSS level, respectively. At this time, the o1 node is changed to the VDDQ level, or high, by the PMOS transistor MP11.

In addition, it is also effective to make the gate width W of the NMOS transistor pair MN6, MN7 constituting the slave latch unbalance so as to fix output values. During a reset, MP11 switches ON and the drain of MN6 becomes the VDDQ level if the gate width W of MN6 is smaller than that of MN7.

As described above, this embodiment prevents the generation of large current due to the occurrence of unfixed values at power-on. Furthermore, this embodiment also eliminates the need for defining the sequence of power on for the power supplies VDD and VDDQ.

Second Embodiment

Figure 4:
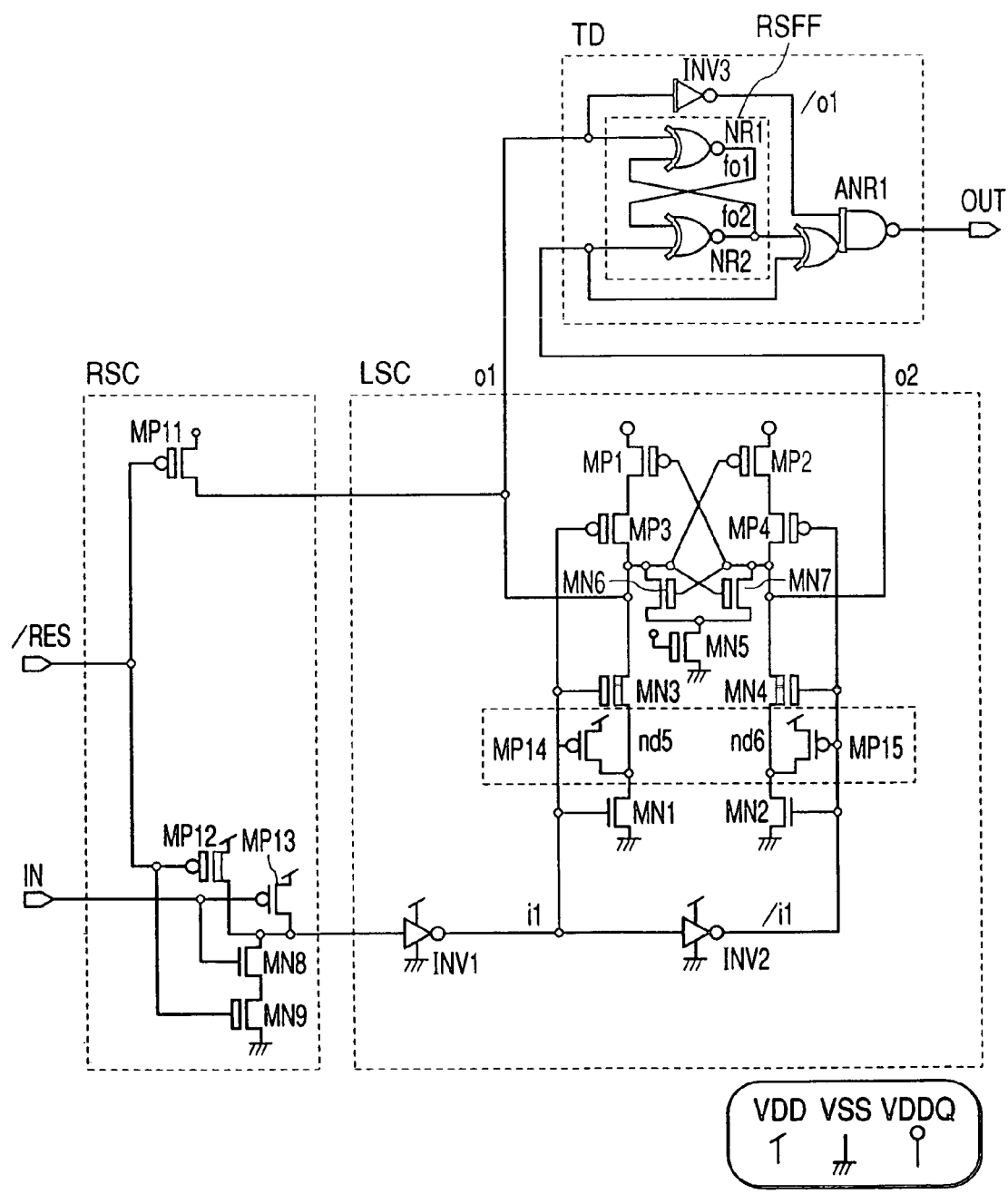
FIG. 4 shows a second embodiment of the present invention.

FIG. 4 shows a second embodiment of the level converter circuit. This drawing is the same as FIG. 1, except for the level shifting circuit LSC. The level shifting circuit of this embodiment differs from that shown in FIG. 1 in that it has no gate boosting circuit for the withstand-voltage-enhancement MOS transistor. In addition, it is also characterized by a level keeping circuit LKP for ensuring the level of the input NMOS transistor's withstand voltage, being configured with each of its complementary input signal pair connected to the gate of a PMOS transistor.

Figure 5:
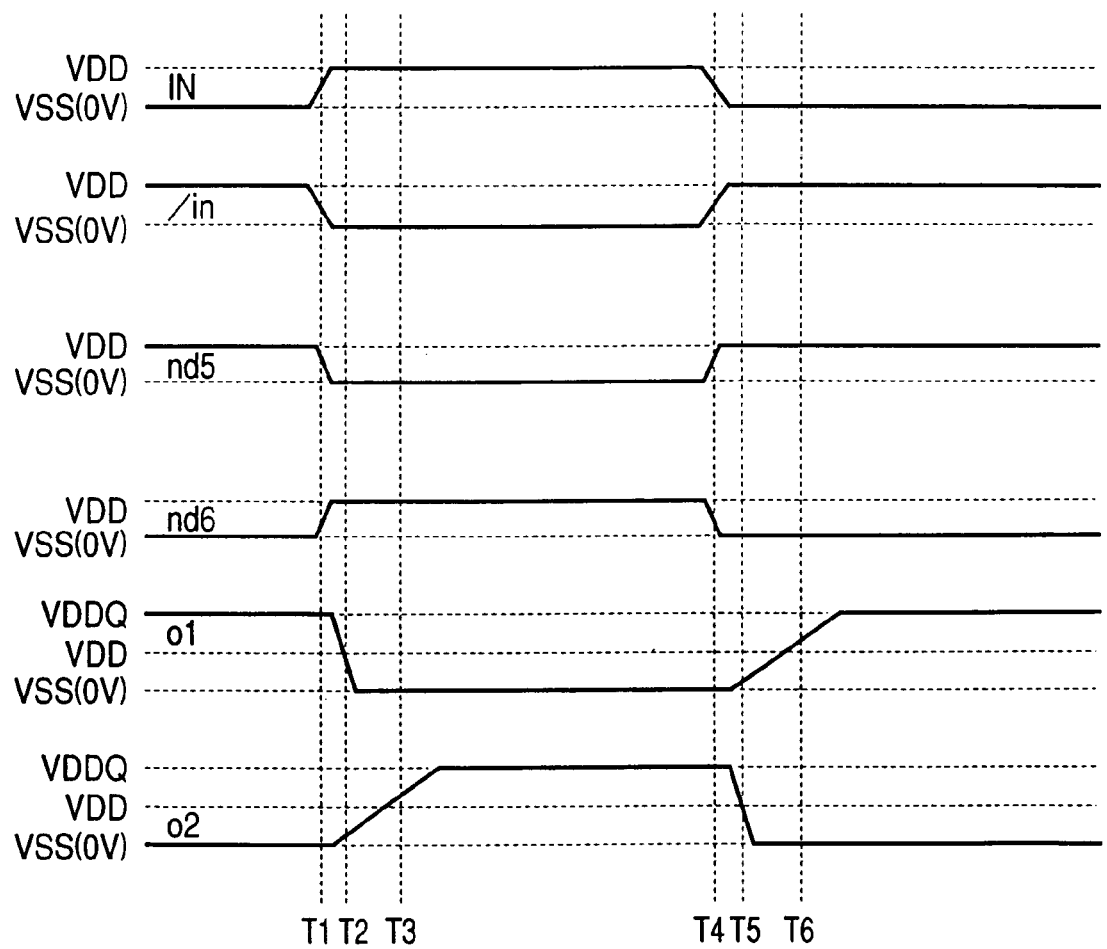
FIG. 5 shows the operating waveforms at major nodes in the second embodiment.

The operations of the level shifting circuit are described with reference to the operating waveforms shown in FIG. 5. FIG. 5 shows the waveforms at the major nodes of the level shifting circuit. First, operations when the input changes from the VSS level to the VDD level is described. At time T1, in response to the input change from the VSS level (0 V) to the VDD level (such as 1 V), the withstand-voltage-enhancement MOS transistor MN3 and the input MOS transistor MN1 switch ON, and the output node o1 is pulled down to the VSS level (0 V). At this time, a potential at the node nd5 (between the withstand-voltage-enhancement MOS transistor MN3 and the input MOS transistor MN1) is pulled down to the VSS level (0 V) because the level keeping circuit composed of a PMOS transistor MP14 switches OFF. In parallel with the series of operations, on the other side of the differential input pair, the input amplitude changes from the VDD level to the VSS level (0 V). In response to this change, the withstand-voltage-enhancement NMOS transistor MN4 and the input NMOS transistor MN2 switch OFF. The switching off of the input NMOS transistor MN2 causes the level keeping circuit composed of a PMOS transistor MN15 to switch ON such that a potential at a node nd6 (between the withstand-voltage-enhancement NMOS MN4 and the input NMOS MN2) stays at the VDD level. At that time, the input NMOS transistor MN2 switches OFF and the NOMS transistor MN2 on the other side of the differential input pair switches ON, which causes a potential at the output node o2 to gradually change to the high voltage VDDQ level (3.3 V, for example). At this time, since the gate of the withstand-voltage-enhancement NMOS transistor MN4 changes to the VSS level (0 V) and its source changes to the VDD level, the amount of sub-threshold leakage current is reduced even if the threshold voltage of the withstand-voltage-enhancement NMOS transistor MN4 is low.

Next, at time T2, in response to the input change from the VDD level to the VSS level (1 V, for example), the withstand-voltage-enhancement NMOS transistor MN4 and the input NMOS transistor MN2 switch ON, and a potential at the output node o2 is pulled down to the VSS level (0 V). At this time, the potential at the node nd6 (between the withstand-voltage-enhancement MOS transistor MN4 and the input MOS transistor MN2) is pulled down to the VSS level (0 V) because the level keeping circuit composed of a PMOS transistor MP15 switches OFF. In parallel with the series of operations, on the other side of the differential input pair, the input amplitude changes from the VDD level to the VSS level (0 V). In response to this change, the withstand-voltage-enhancement NMOS transistor MN3 and the input NMOS transistor MN1 switch OFF. The switching off of the input NMOS transistor MN1 causes the level keeping circuit composed of a PMOS transistor MN14 to switch ON such that a potential at a node nd5 (between the withstand-voltage-enhancement NMOS transistor MN3 and the input NMOS transistor MN1) stays at the VDD level. At that time, the input NMOS transistor MN1 switches OFF and the NOMS transistor MN2 on the differential input pair side switches ON, which causes the potential at the output node o1 to gradually change to the high voltage level (VDDQ). At this time, since the gate of the withstand-voltage-enhancement NMOS transistor MN4 changes to the VSS level (0 V) and its source changes to the VDD level, the amount of sub-threshold leakage current is reduced even if the threshold voltage of the withstand-voltage-enhancement NMOS transistor MN4 is low.

As described above, the level shifting circuit of this embodiment switches the withstand-voltage-enhancement MOS transistor OFF adequately when the input NMOS transistor is in the OFF state, thereby reducing the amount of leakage current in the standby mode of the level converter circuit.

The first embodiment is characterized by use of a gate boosting circuit to boost the voltage of the gate of the withstand-voltage-enhancement MOS transistor using a thick-film low-threshold MOS transistor. To obtain the boosting voltage DV (about 0.3 V), the second embodiment reduces the threshold voltage by a value of DV (about 0.3 V) to cause the level converter circuit to operate at the same input signal voltage level as in the first embodiment. Specifically, the threshold voltages of the first MISFET pair MN1, MN2 that receive an input signal are set to medium level values, the threshold voltages of the second MISFET pair MN3, MN4 for enhancing withstand voltages for the first MISFET pair are set to values smaller than those of MN1, MN2, and the threshold voltages of the third MISFET pair MP1, MP2 having cross-coupled gates and for latching the second signal (output) are set to values higher than those of MN1, MN2. Unlike the first embodiment, the second embodiment of the present invention eliminates the need for dynamic operations involving driving of capacitive elements, thereby enabling reliable level conversion even when an input signal changes gradually from the VDD level to the VSS level or vice versa.

In this embodiment, it is also effective to substitute High-k material oxide films for the gate oxide films of the input NMOS transistors MN1, MN2. Such a High-k material may be $Al_2O_3$, $ZrO_2$, or $HfO_2$. It is necessary to make the gate widths of the input NMOS transistors MN1, MN2 larger than those of MP1, MP2, as in the first embodiment. This substitution eliminates the need for reducing the gate oxide film thickness so as to avoid a problem of gate leakage current.

The embodiment described above is also characterized by the use of a low-threshold MOS transistor as the withstand-voltage-enhancement MOS transistor. If the power supply voltage of an input signal is not low, such as VDD=1.2 V, it is also possible to configure the withstand-voltage-enhancement MOS transistor with a standard-threshold MOS transistor, which eliminates the need for incorporating an extra low-threshold MOS transistor thereby avoiding increase in the process cost.

Figure 9:
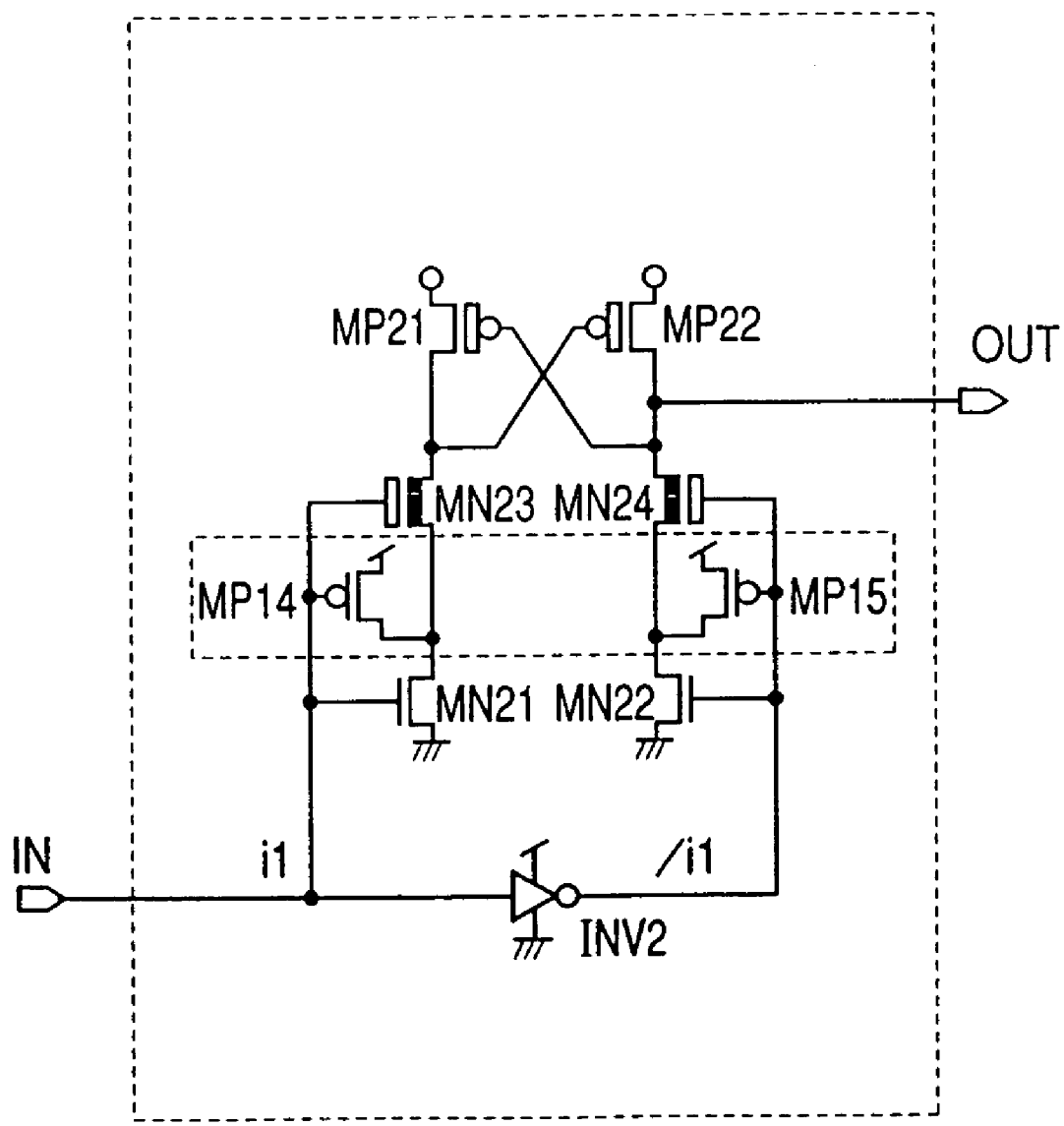
FIG. 9 shows the main parts of the second embodiment of the lever converter circuit in FIG. 4.
Figure 9:
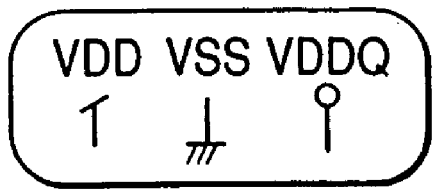

FIG. 9 shows the basic structure of the second embodiment shown in FIG. 4, which includes PMOS load transistors MP21, MP22, input NMOS transistors MN21, MN22, withstand-voltage-enhancement NMOS transistors MN23, MN24, and withstand-voltage-keeping PMOS transistors MP23, MP24. The source of MN21 is connected to VDDQ, the drain of MN21 is connected to the drain of MN23, and the gate of MN21 is connected to the drains of MN23 and MP21. The gate of MN23 is connected to the gates of MN21 and MP23, and the source of MN23 is connected to the drains of MN21, MP23. The gate of MN24 is connected to the gates of MN22, MP24, and the source of MN24 is connected to the drains of MN22, MP24. The sources of MP23 and MP24 are connected to the VDD power supply, and the sources of MN21 and MN22 are connected to the VSS (0 V) power supply. The structure common to the level shifting circuits shown in FIGS. 1, 4, and 9 is summarized as follows. They are a semiconductor device including a differential level shifting circuit that outputs a second signal having a larger amplitude than an amplitude of the first signal. The differential level shifting circuit has a first MISFET pair (MN1, MN2 in FIG. 1, and MN21, MN22 in FIG. 9) for receiving the first signal, a second MISFET pair (MN3, MN4 in FIG. 1, and MN23, MN24 in FIG. 9) for enhancing a withstand voltage of the first MISFET pair, and a third MISFET pair (MP1, MP2 in FIG. 1, and MP21, MP22 in FIG. 9). The film thickness of the gate insulating film of the second MISFET pair is made thicker than the film thickness of the gate insulating film of the first MISFET pair, and the film thickness of the gate insulating film of the third MISFET pair is made thicker than the film thickness of the gate insulating film of the first MISFET pair. The threshold voltage of the second MISFET pair is made smaller than (in absolute value) the threshold voltage of the third MISFET pair, and the threshold voltage of the first MISFET pair is made smaller than (in absolute value) the threshold voltage of the third MISFET pair. In such a structure, the relationship between the film thicknesses of the gate insulating films can be converted into the relationship between their respective withstand voltages: the second and third MISFET pairs have higher withstand voltages than the first MISFET pair.

The aforementioned embodiment is also characterized by the use of a low-threshold MOS transistor as the withstand-voltage-enhancement MOS transistor. If the input signal power supply voltage is not low, such as VDD=1.2 V, it is possible to configure the withstand-voltage-enhancement MOS transistor with a standard-threshold MOS transistor. More specifically, it is possible to use thick oxide films to form MP21, MP22, MN23, and MN24 in FIG. 9 such that they have the same threshold voltage thereby omitting the ion implantation for reducing the threshold voltages of MN23 and MN24. It should be noted that MN21, MN22, MP14, and MP15 are formed with thin oxide films. In this case, there is no need to specially use low-threshold MOS transistors as MN23 and MN24. As such, this embodiment does not increase process cost.

Up to this point, descriptions have been given on a level converter circuit that converts a signal of smaller amplitude (varying between the VSS level (0 V) and the VDD level (1 V, for example)) to a signal of greater amplitude (varying between the VSS level (0 V) and the VDDQ level (3.3 V, for example)). A level converter circuit that converts a signal of smaller amplitude varying between the VSS level (0 V) and the VDD level (1 V, for example) to a signal of greater amplitude varying between the VBGN level (−1.2 V, for example) and the VBGP level (2.4 V, for example) is described below.

A system-on-a-chip circuit employs so-called chip control technology by which the substrate voltage on the NMOS transistor side is set to the VBGN potential level that is smaller than the VSS (0 V) level, and the substrate voltage on the PMOS transistor side is set to the VBGP potential level that is higher than the VDD level. The use of such a technology requires control on switching the substrate voltages between the VSS level (0 V) and the VBGN level for the NMOS transistor side, and between the VDD level and the VBGP level for the PMOS transistor side. The key of the system-on-a-chip control is a signal of small amplitude varying between the VSS level (0 V) and the VDD level. Therefore, it is necessary to control the level conversion with a signal of smaller amplitude. However, since this signal has an amplitude smaller than that of the power supply voltage, if a MOS transistor is used to control the switching operation, the MOS transistor cannot fully switch ON or OFF. As such, a level converter circuit for converting signal amplitude is indispensable.

In this case, if the voltage of a small-amplitude signal becomes smaller, it becomes difficult to directly convert the small-amplitude signal to a signal with an amplitude varying between the VBGP and VBGN levels. This problem can be solved by converting the small-amplitude signal to a larger-amplitude signal varying between the VBGP and VSS levels, then converting the converted signal to a final output signal varying between the VBGP and VBGN levels.

Third Embodiment

Figure 10:
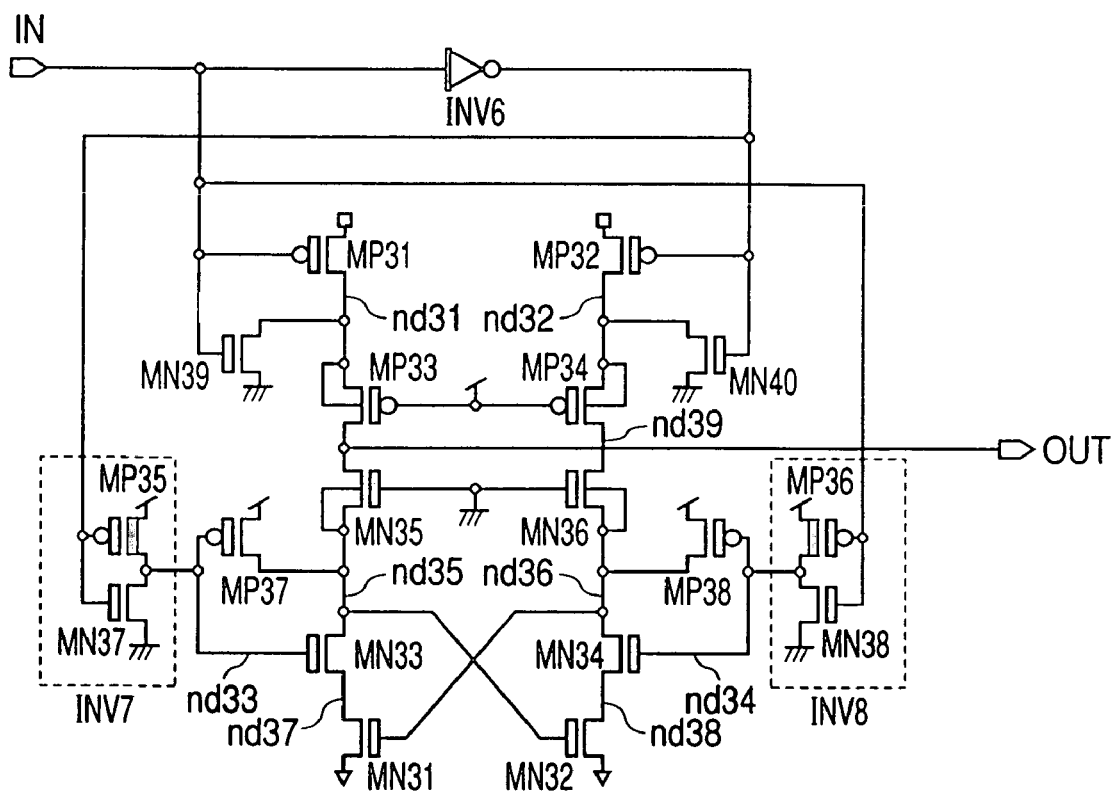
FIG. 10 shows a first embodiment of a second-stage level converter circuit for converting the output signal of the first-stage level converter circuit as shown in FIG. 1 or FIG. 4 that varies between power supply potentials VBGP and VSS to a signal that varies between power supply potentials VBGP and VBGN according to the present invention.
Figure 10:
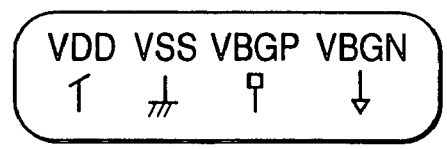

FIG. 10 shows a level converter circuit for converting a converted signal ranging between the VSS level (0 V) and the VBGP level to a signal ranging between the VBGN level and the VBGP level. Specifically, a small-amplitude input signal that varies between the VSS level (0 V) and the VDD level is converted to a large amplitude signal that varies between the VSS level (0 V) and the VBGP level by using the level converter circuits in FIGS. 1 and 4, and other figures, or a prior-art level converter circuit, and then input to this second-stage level converter circuit.

The circuit structure of this embodiment is described below. This level converter circuit includes input PMOS transistors MP31, MP32, withstand-voltage-enhancement PMOS transistors MP33, MP34, withstand-voltage-enhancement NMOS transistors MN35, MN36, NMOS load transistors MN31, MN32, current-control NMOS transistors MN33, MN34, withstand-voltage-keeping NMOS transistors MN39, MN40, withstand-voltage-keeping PMOS transistors MP37, MP38, an thick-film MOS inverter INV6, and inverters INV7, INV8, in which only PMOS transistors are of the low-threshold type.

The reason for introducing withstand-voltage MOS transistors is described as follows. The VBGP level is set at the 2VDD level (twice the VDD level), and the VBGN level is set at the −VDD level. If the upper limit value of the VDD voltage is set as 1.4 V, for example, the voltage difference between VBGP and VBGN becomes as high as 4.2V, which exceeds the withstand voltage (3.6 V, for example) of a thick-film MOS transistor. The level converter circuit of this embodiment is characterized with a withstand-voltage-enhancement circuit provided to prevent the voltage difference from exceeding the withstand voltage of an employed MOS transistor therein.

The interconnection among these MOS transistors is described below. The source of MP31 is connected to VBGP, its drain is connected to the drains of MN39 and MP33, and its gate is connected to the input node and the gate of MN39. The source of MP32 is connected to VBGP, its drain is connected to the drains of MP34 and MP40, and its gate is connected to the output of the inverter INV6 and the gate of MN40. The source of MP33 is connected to the drains of MP31 and MN39, its drain is connected to the drain of MN35, and its gate is connected to the VDD power supply. The source of MP34 is connected to the drains of MP32 and MN40, its drain is connected to the drain of MN36, and its gate is connected to the VDD power supply. The source of MN35 is connected to the drains of MP37, MN33 and the source of MN32, its drain is connected to the drain of MP33, and its gate is connected to the VSS power supply. The source of MN36 is connected to the drains of MP38, MN34 and the source of MN31, its drain is connected to the drain of MP34, and its gate is connected to the VSS power supply. The source of MN33 is connected to the drain of MN31, its drain is connected to the drain of MP37, the source of MN35, and the gate of MN32, and its gate is connected to the output of INV7. The source of MN34 is connected to the drain of NM32, its drain is connected to the drain of MP38, the source of MN36, and the gate of MN31, and its gate is connected to the output of INV8. The source of MN31 is connected to VBGN, its drain is connected to MN33, and its gate is connected to the drain of MN34, the source of MN36, and the drain of MP38. The source of MN32 is connected to VBGN, its drain is connected to MN34, and its gate is connected to the drain of MN33, the source of MN35, and the drain of MP37. The source of MP37 is connected to VDD, its drain is connected to the drains of MN33, MN35 and the gate of MN32, and its gate is connected to the VSS power supply. The source of MP38 is connected to VDD, its drain is connected to the drains of MN34 and MN36 and the gate of MN31, and its gate is connected to the VSS power supply. The inverter INV7 includes a PMOS transistor MP35 and an NMOS transistor MN37, in which the source of MP35 is connected to VDD, its drain is connected to the drain of MN37 and the gates of MP37 and MN33, and its gate is connected to the output of INV6. The inverter INV8 includes a PMOS transistor MP36 and an NMOS transistor MN38, in which the source of MP36 is connected to VDD, its drain is connected to the drain of MN38 and the gates of MP38, MN34, and its gate is connected to the input of the second-stage level converter circuit.

The substrate potential of MP31, MP32, and a PMOS transistor INV6 is VGBP, the substrate potential of MP35, MP36, MP37, and MP38 is VDD, the substrate potential of MN37, MN38, MN39, and MN40 is VSS, and the substrate potential of MN31, MN32, MN33, and MN34 is VBGN. The substrate potential of MP33 equals to its source potential, the substrate potential of MP34 equals to its source potential, the substrate potential of MN35 equals to its source potential, and the substrate potential of MN36 equals to its source potential. The substrate potentials of MN35, MN36, MP33, and MP34 change in response to the potential change of the sources of transistors to which they are connected.

Figure 11:
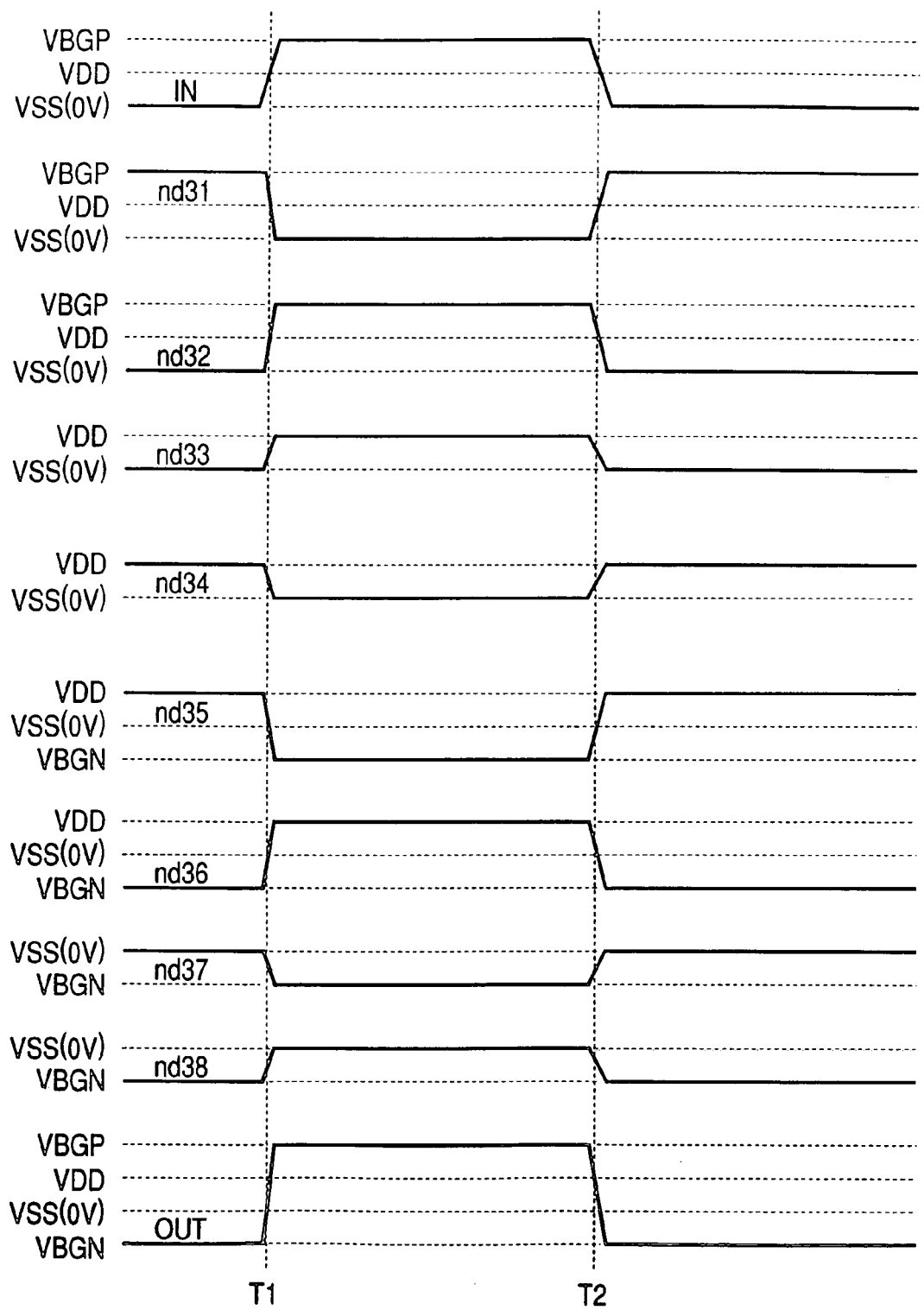
FIG. 11 shows the operating waveforms at major nodes in the level converter circuit shown in FIG. 10.

The operating waveforms at major nodes are described with reference to FIG. 11. The operations when the input IN changes from the VSS level (0 V) to the VBGP level at time T1 is described below. When the input IN changes to the VBGP level, MP31 switches OFF, and MN39 switches ON. Since the potential at the output of the inverter INV6 that receives the input IN changes from the VBGP level to the VSS level, MP 32 switches ON and MN40 switches OFF. Therefore, the potential at a node nd31 changes from the VBGP level to the VSS level (0 V), and the potential at a node nd32 changes form the VSS level to the VBGP level. On the other hand, the potential at an output node nd33 of the inverter INV7 that receives the input of INV6 changes from the VSS level (0 V) to the VDD level. The potential at an output node nd34 of the inverter INV8 that receives the input IN changes from the VDD level to the VSS level. At this time, when the potential at the node nd34 changes from the VDD level to the VSS level, MP38 switches ON and simultaneously MN34 switches OFF such that the potential at a node nd36 changes to the VDD level. When the potential at the node nd36 changes to the VDD level, MN31 switches ON, and the potential at a node nd37 changes to the VBGN level. When the potential at the node nd36 changes from the VBGN level to the VDD level, since the gate potential of MN36 is at the VSS level, MN36 switches OFF firmly. In this case, since the potential at the node nd32 is at the VBGP level and the gate potential of MP34 is at the VDD level, MP34 changes to the ON state, and the potential at a node nd39 changes to the VBGP level. When the potential at the node nd33 changes from the VSS level to the VDD level, MP37 switches OFF, and simultaneously the potential at a node nd35 changes to the VBGN level. When the potential at the node nd35 changes from the VDD level to the VBGN level, since the gate potential of MN35 is at the VSS level, MN35 changes to the ON state such that the potential at an output node OUT changes to the VBGN level. When the potential at the output node OUT changes to the VBGN level, since the gate potential of MP33 is at the VDD level and the potential at the node nd31 is at the VSS level, MP33 switches OFF firmly.

Next, the operations when the input IN changes from the VBGP level to the VSS level at time T2 are described below. When the input IN changes to the VSS level, MP31 switches ON, and MN39 switches OFF. Since the potential at the output of the inverter INV6 that receives the input IN changes from the VSS level to the VBGP level, MP 32 switches OFF and MN40 switches ON. Therefore, the potential at nd31 changes from the VSS level to the VBGP level, and the potential at nd32 changes form the VBGP level to the VSS level. On the other hand, the potential at the output node nd33 of the inverter INV7 that receives the input of INV6 changes from the VDD level to the VSS level. The potential at the output node nd34 of the inverter INVB that receives the input IN changes from the VSS level to the VDD level. At this time, when the potential at the node nd33 changes from the VDD level to the VSS level, MP37 switches ON and simultaneously MN34 switches OFF such that the potential at the node nd35 changes to the VDD level. When the potential at the node nd35 changes to the VDD level, MN32 switches ON, and the potential the node nd38 changes to the VBGN level. When the potential at the node nd35 changes from the VBGN level to the VDD level, since the gate potential of MN35 is VSS, MN35 switches OFF firmly. In this case, since the potential at the node nd31 is at the VBGP level and the gate potential of MP33 is at the VDD level, MP33 changes to the ON state, the potential at the output node OUT changes to the VBGP level. When the potential at the node nd34 changes from the VSS level to the VDD level, MP38 switches OFF, and simultaneously the node nd36 changes to the VBGN level. When the potential at the node nd36 changes from the VDD level to the VBGN level, since the gate potential of MN36 is VSS, MN36 changes to the ON state such that the potential at the node nd39 changes to the VBGN level. When the potential at the node nd39 changes to the VBGN level, since the gate potential of MP34 is at the VDD level and the potential at the node nd32 is at the VSS level, MP34 switches OFF firmly.

This embodiment, if the input signal amplitude becomes smaller due to lowered voltage, converts the small-amplitude signal to a large-amplitude signal, and then converts the large-amplitude signal to a final output signal thereby providing reliable level conversion. In addition, this embodiment effectively uses a withstand-voltage-enhancement MOS transistor even if the voltage of an output signal becomes higher than the withstand voltage of the MOS transistors included therein. Therefore, this embodiment eliminates the use of high-withstand-voltage MOS transistors therein thereby avoiding the manufacturing cost increase.

Fourth Embodiment

Figure 12:
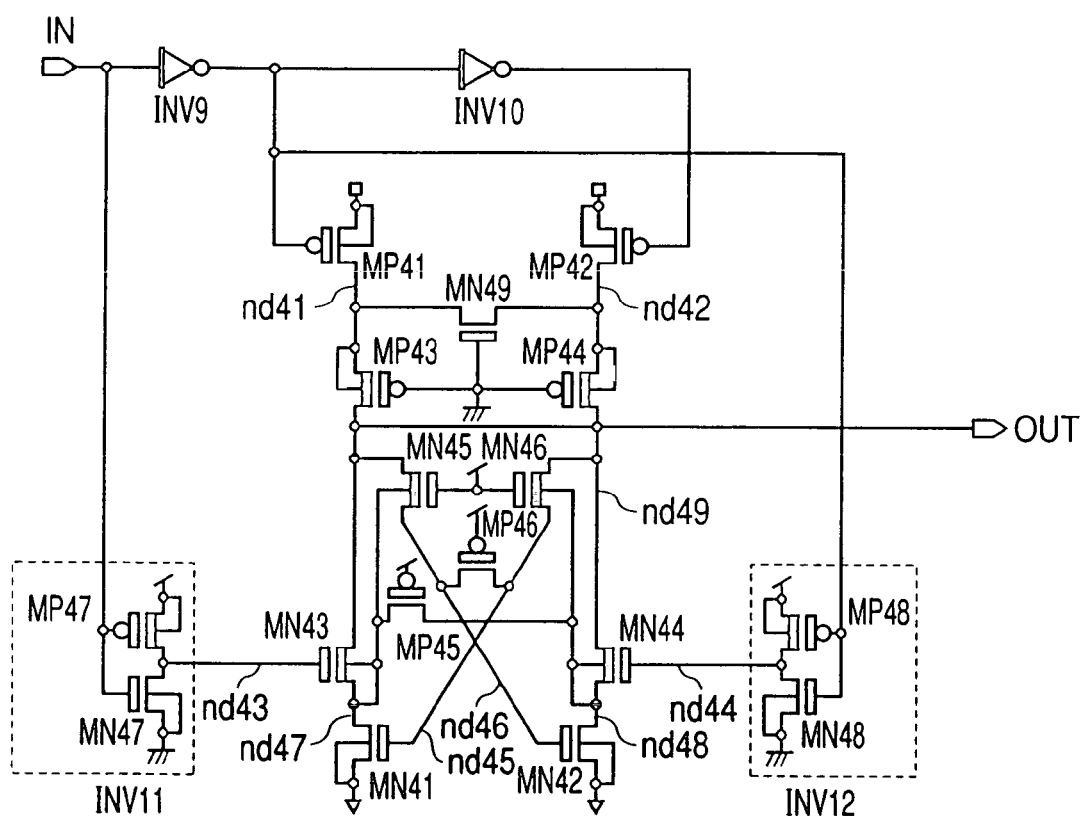
FIG. 12 shows another embodiment of the second-stage level converter circuit for converting the output signal of the first-stage level converter circuit as shown in FIG. 1 or FIG. 4 that varies between power supplies VBGP and VSS to a signal that varies between power supplies VBGP and VBGN according to the present invention.
Figure 12:
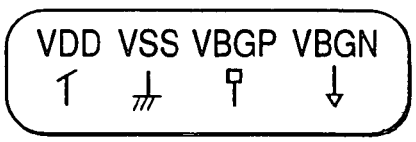

FIG. 12 shows another embodiment of the second-stage level converter circuit that converts a converted signal ranging between 0 V and the VBGP level to a signal ranging between the VBGN and VBGP levels. In this embodiment, a small-amplitude signal ranging between 0 V and the VDD level can be also converted to a signal ranging between 0 V and the VBGP level by using the second-stage level converter circuit shown in FIG. 1 or FIG. 4 or a prior-art level converter circuit, and then input to the level converter circuit according to the present invention. This embodiment, as described in the embodiment shown in FIG. 10, is also susceptible to a problem that the voltage difference between VBGP and VBGN may exceed the withstand voltage of a thick-film MOS transistor (3.6 V, for example). Therefore, the circuit according to this embodiment provides a withstand-voltage-enhancement circuit to prevent the voltage difference from exceeding the withstand voltage of an employed MOS transistor therein.

The circuit configuration of this embodiment is described next. This circuit includes input PMOS transistors MP41, MP42, withstand-voltage-enhancement PMOS transistors MP43, MP44, withstand-voltage-enhancement NMOS transistors MN45, MN46, NMOS load transistors MN41, MN42, current-control NMOS transistors MN43, MN44, withstand-voltage keeping PMOS transistors MP45, MP46, a withstand-voltage keeping NMOS transistor MN49, inverters INV19, INV10 (including thick-film MOS transistors), and inverters INV11, INV12 in which only a PMOS transistor is of the low-threshold type. If MN45, MN46, MN43, and MN44 are composed of low-threshold MOS transistors, they can operate at smaller voltages. Furthermore, although not shown in the drawing, MP43 and MP44 can operate at smaller voltages by using low-threshold MOS transistors.

Next, the interconnection among these MOS transistors is described. The source of MP41 is connected to VBGP, its drain is connected to the drain of MP43 and the source (or drain) of MN49 and its gate is connected to the input node. The source of MP42 is connected to VBGP, its drain is connected to the drain of MP44 and the drain (source) of MN49, and its gate is connected to the inverting input. The source of MP43 is connected to the drain of MP41 and the source (drain) of MN49, and its drain is connected to the drains of MN43 and MN45. The source of MP44 is connected to the drain of MP42 and the drain (source) of MN49, and its drain is connected to the drains of MN44 and MN46. The source of MN45 is connected to the drains of MP43 and MN43 and the output OUT, its drain is connected to the drain (source) of MP46 and the gate of MP42, and its gate is connected to VDD. The source of MN46 is connected to the drains of MP44 and MN44, its drain is connected to the drain (source) of MP46 and the gate of MP41, and its gate is connected to the VDD power supply. The source of MN43 is connected to the drain of MN41, its drain is connected to the source of MN45 and the drain of MP43, and its gate is connected to the output of the INV11. The source of MN44 is connected to the drain of MN42, its drain is connected to the source of M46 and the drain of MP44, and its gate is connected to the output of the INV12. The source of MN41 is connected to VBGN, its drain is connected to the drains (sources) of MN43 and MN45, and its gate is connected to the drain of MN46 and the source (drain) of MP46. The source of MN42 is connected to VBGN, its drain is connected to the sources (drains) of MN44 and MP45, and its gate is connected to the drain of MN45 and the drain (source) of MP46. The inverter INV11 is composed of a PMOS transistor MP47 and an NMOS transistor MN47, in which the source of MP47 is connected to VDD, its drain is connected to the drain of MN47 and the gate of MN43, and its gate is connected to the input IN. In this example, MP47 is a low-threshold MOS transistor. The inverter INV12 is composed of a PMOS transistor MP48 and an NMOS transistor MN48 with the source of MP48 connected to VDD, the drain of MP48 connected to the drain of MN48 and the gate of MN44, and the gate of MP48 connected to the output of the inverter INV9. In this example, MP48 is a low-threshold MOS transistor. The substrate potential of each of the MOS transistors is described below. The substrate potentials of MP41, MP42, and PMOS transistors included in INV9 and INV10 are VBGP, the substrate potentials of MP45 and MP46 are VDD, the substrate potentials of MN47, MN48, and MN49 are VSS, and the substrate potentials of MN41 and MN42 are VBGN. The substrate potential of MP43 equals to its source potential, the substrate potential of MP44 equals to its source potential, the substrate potentials of MN43 and MN45 equal to the source potential of MN43, and the substrate potentials of MN44 and MN46 equal to the source potential of MN44. The substrate potentials of MN43, MN44, MN45, MN46, MP43, and MP44 vary according to changes in source potentials of transistors to which they are connected, respectively.

The functions of MP45, MP46, and MN49 is described below. MP45 is used to prevent potentials at the nodes nd47 and nd48 from being boosted above the VDD level. This causes current to flow to the substrate side of MP45 before the potentials at the nodes nd47 and nd48 are boosted above the VDD level such that the potentials at the nodes nd47 and nd48 are never boosted above the VDD level. MP46 is used to prevent potentials at the nodes nd45 and nd46 from being boosted above the VDD level. This causes current to flow to the substrate side of MP46 before the potentials at the nodes nd45 and nd46 are boosted above the VDD level such that the potentials of the nodes nd45 and nd46 are never boosted above the VDD level. MP49 is used to prevent potentials at the nodes nd41 and nd42 from being reduced below the VSS level. This causes current to flow from the substrate side of MP49 before the potentials at the nodes nd47 and nd48 are reduced below the VSS level such that the potentials of the nodes nd41 and nd42 are never reduced below the VDD level.

Figure 13:
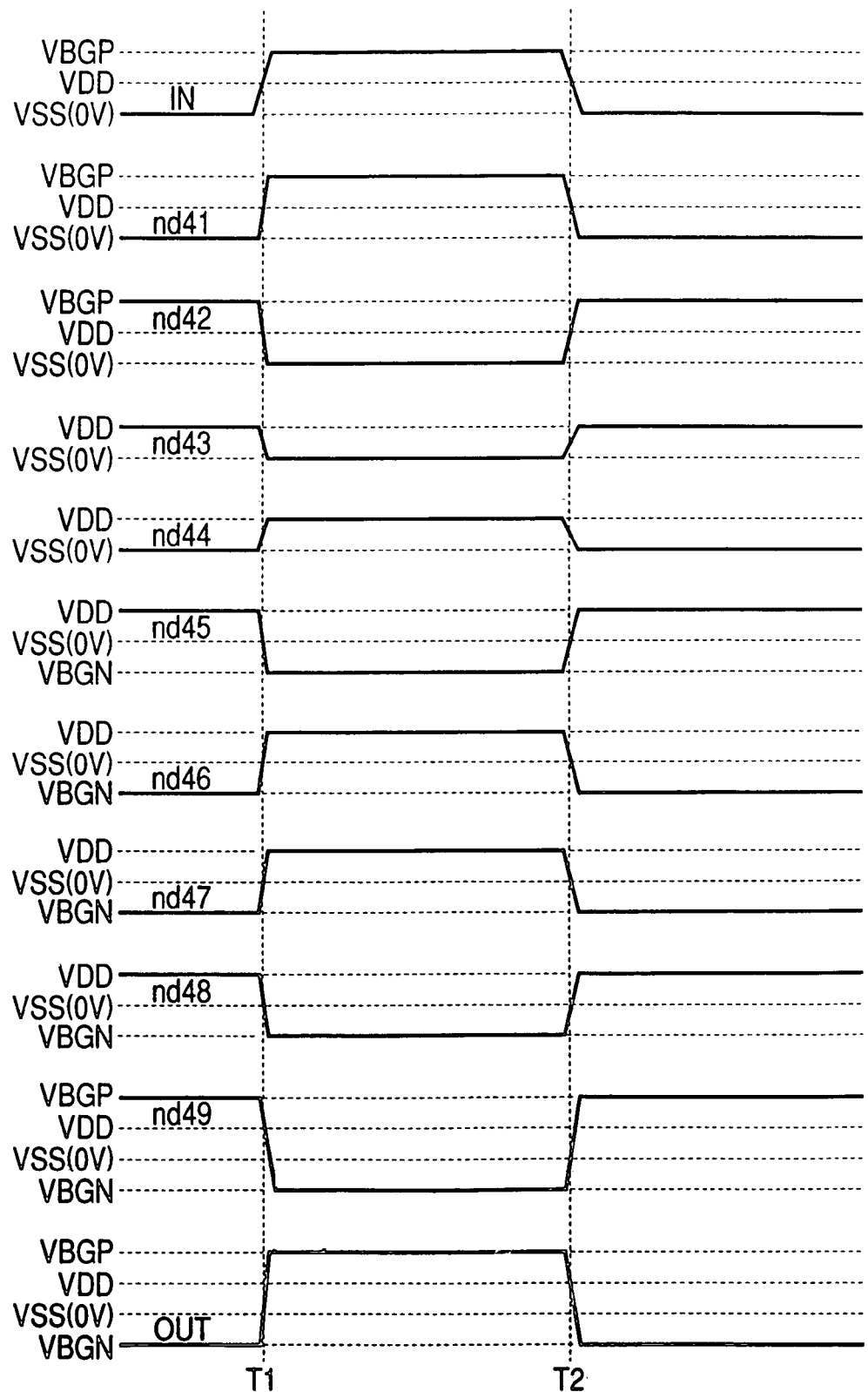
FIG. 13 shows the operating waveforms at major nodes of the level converter circuit shown in FIG. 12.

FIG. 13 shows the operating waveforms of the embodiment shown in FIG. 12. The operations when the input IN changes to the VSS level at time T1 is described below. When the input IN changes to the VSS level, the output of INV9 changes to the VBGP level, and the potential at the output of INV10 changes to the VSS level. Accordingly, MP41 switches OFF and MP42 enters the ON state. Therefore, the node nd41 enters the high-resistance state due to interruption of the path to the VBGP power supply, and the potential at the node nd42 changes to the VBGP level. At this time, the gate potential of MP44 is at the VSS level such that MP44 enters the ON state to bring the nodes nd42 and nd44 into conduction, and the potential at the node nd49 changes to the VBGP level. When the potential at the node nd49 changes to the VBGP level, since the gate potential of MN46 is at the VDD level, MN46 acts as a withstand-voltage-enhancement MOS transistor, and the potential at the node nd45 changes to the VDD level. When the potential at the node nd45 changes to the VDD level, MN41 switches ON. On the other hand, at time T1, the potential at an output node nd43 of the inverter INV11 changes from the VSS level to the VDD level, and the potential at the output node nd44 of the inverter INV12 changes from the VDD level to the VSS level. Accordingly, MN43 switches ON, and MN44 switches OFF. Therefore, the switching ON of MN43 brings the node nd47 and the output node OUT into conduction, and changes the potential at the output node OUT to the VBGN level. When the potential at the output node OUT changes to the VBGN level, since the gate of MN45 is at the VDD level, MN45 switches ON, which brings the node nd46 and the output node OUT into conduction, and changes the potential at the node nd46 to the VBGN level. When the potential at the node nd46 changes to the VBGN level, MN42 switches OFF. At this time, MN44 acts as a withstand-voltage-enhancement MOS transistor such that the potential at the node nd48 changes to the VSS level. When the potentials at the node nd47 and the output node OUT change to the VBGN level, MP43 acts as a withstand-voltage-enhancement MOS transistor, which changes the potential at the node nd41 to the VSS level.

When MN42 switches OFF, since the potential at the node nd49 is at the VBGP level the potential at nd48 may be boosted to the VBGP level due to leakage current caused when MN44 switches OFF. However, since the substrate potential of MP45 is at the VDD level which causes current to flow to the substrate side if the potential at the node nd48 is boosted above the VDD level such that the potential at nd48 is prevented from being boosted above the VDD level. Similarly, since the potential at the node nd49 is at the VBGP level, the potential at nd45 may be boosted to the VBGP level due to leakage current caused when MN46 switches OFF. However, since the substrate potential of MP46 is at the VDD level which causes current to flow to the substrate side if the potential at the node nd45 is boosted above the VDD level, the potential at nd45 is prevented from being boosted above the VDD level.

As described above, the maximum source-drain, drain-gate, and gate-source apply voltages to the MOS transistors in this embodiment are VBGP-VSS or VDD-VBGN. At this time, if VBGP=2VDD and VBGN=−VDD, the maximum apply voltage for each MOS transistor is within 2VDD. Therefore, the circuit design with VDD=1.2 V and MOS withstand voltage=3.6 V achieves the maximum apply voltage smaller than the withstand voltage.

Next, the operations when the input IN changes to the VBGP level at time T2 are described. When the input IN changes to the VBGP level, the output of INV9 changes to the VSS level, and the output of INV10 changes to the VBGP level. Accordingly, MP41 switches ON and MP42 enters the OFF state. Therefore, the node nd42 enters the high-resistance state due to interruption of the path to the VBGP power supply, and the potential at the node nd41 changes to the VBGP level. At this time, the gate potential of MP43 is at the VSS level such that MP43 enters the ON state, which brings the nodes nd41 and nd43 into conduction, and changes the potential at the output node OUT to the VBGP level. When the potential at the output node OUT changes to the VBGP level, since the gate potential of MN45 is at the VDD level, MN45 acts as a withstand-voltage-enhancement MOS transistor, and the potential at the node nd46 changes to the VDD level. When the potential at the node nd46 changes to the VDD level, MN42 switches ON. On the other hand, at time T2, the potential at the output node nd43 of the inverter INV11 changes from the VDD level to the VSS level, and the potential at the output node nd44 of the inverter INV12 changes from the VSS level to the VDD level. Accordingly, MN43 switches OFF, and MN44 switches ON. Therefore, the switching on of MN44 brings the nodes nd48 and nd49 into conduction so as to change the node nd49 to the VBGN level. When the potential at the node nd49 changes to the VBGN level, since the gate of MN46 is at the VDD level, MN46 switches ON, which brings the nodes nd45 and nd49 into conduction so as to change the node nd45 to the VBGN level. When the node nd45 changes to the VBGN level, MN41 switches OFF. At this time, since MN43 acts as a withstand-voltage-enhancement MOS transistor, and the potential at the node nd48 changes to the VSS level. When the potentials at the nodes nd48 and nd49 change to the VBGN level, MP44 acts as a withstand-voltage-enhancement MOS transistor, which changes the potential at the node nd42 to the VSS level.

When MN41 switches OFF, since the potential at the output node OUT is at the VBGP level, the potential at nd47 may be boosted to the VBGP level due to leakage current caused when MN43 switches OFF. However, since the substrate potential of MP45 is at the VDD level which causes current to flow to the substrate side if the potential at the node nd47 is boosted above the VDD level, the potential at nd47 is prevented from being boosted above the VDD level. Similarly, since the output node OUT is at the VBGP level, the potential at nd46 may be boosted to the VBGP level due to leakage current caused when MN45 switches OFF. However, since the substrate potential of MP45 is at the VDD level which causes current to flow to the substrate side if the potential at the node nd46 is boosted above the VDD level, the potential at nd46 is prevented from being boosted above the VDD level.

As described above, the maximum source-drain, drain-gate, and gate-source apply voltages for MOS transistors in this embodiment are VBGP-VSS or VDD-VBGN. If VBGP=2VDD and VBGN=-VDD, the maximum apply voltage for each MOS transistor is within 2VDD. Therefore, the circuit design with the maximum apply voltage=3.6 V and VDD=1.2 V achieves the maximum apply voltage smaller than the withstand voltage.

This embodiment suppresses the apply voltage to each MOS transistors below the withstand voltage even if its output signal amplitude becomes higher than the withstand voltage of MOS transistors. This allows configuration of a level converter circuit without using higher-withstand-voltage MOS transistors thereby avoiding manufacturing cost increase.

Fifth Embodiment

Figure 14:
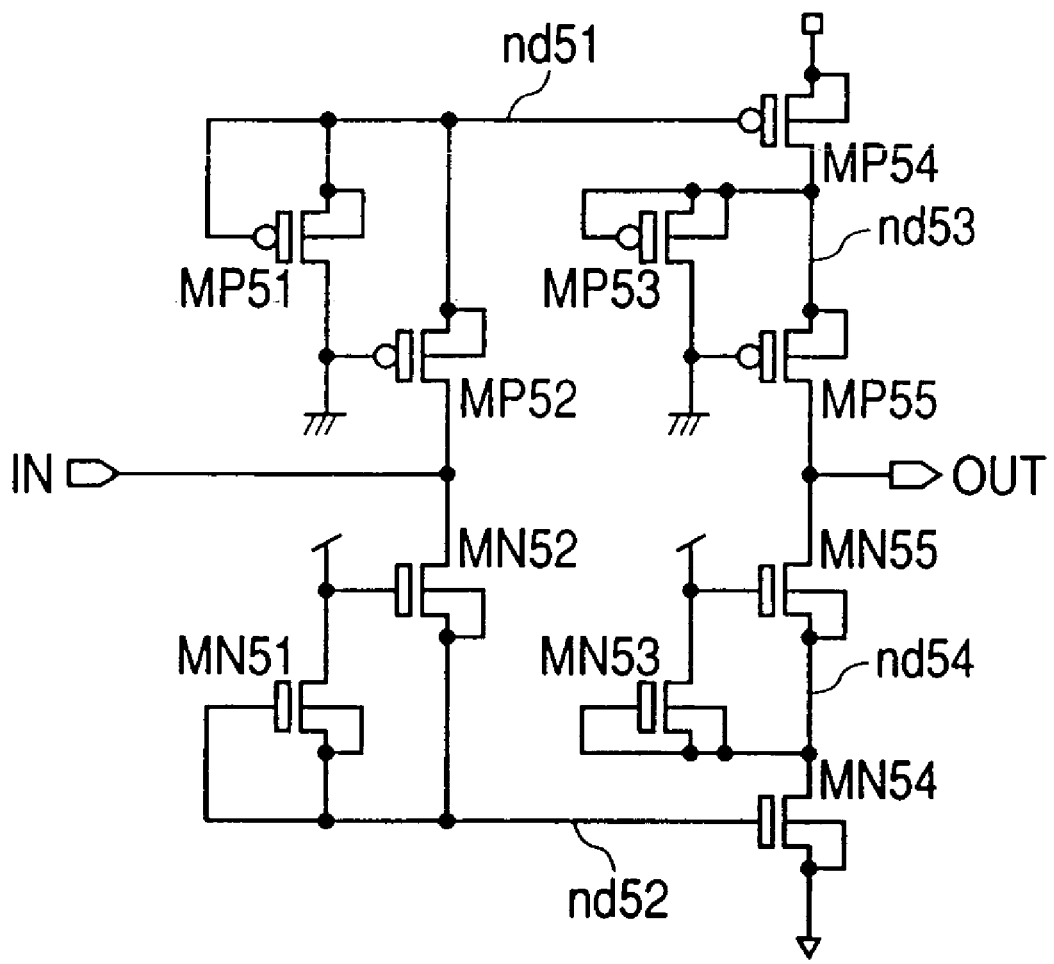
FIG. 14 shows one embodiment of an inverter that inverts the output signal from the second-stage level converter circuit, i.e., a signal that varies between power supplies VBGP and VBGN according to the present invention.

FIG. 14 shows one embodiment of an inverter that transmits a signal ranging between the VBGN and VBGP (supply voltage). In this embodiment, it is assumed that VBGN<VSS (0 V)<VDD<VBGP. As described above, the difference between the VBGN and VBGP potentials may exceed the withstand voltage of a thick-film MOS transistor. an inverter of the invention maintains a voltage relationship such that the potential difference between the VBGN and VDD potentials and the difference between 0 V and the VBGP potentials fall within the withstand voltage of a thick-film MOS transistor, but the potential difference between the VBGN and VBGP potentials do not fall within the withstand voltage of a thick-film MOS transistor.

First, the interconnection among the devices is described. Regarding a PMOS transistor MP51, its gate and source are interconnected, and the interconnected line is further connected to the source of a PMOS transistor MP52 and the gate of a PMOS transistor MP54. The drain of MP51 is connected to VSS. The gate of MP52 is connected to VSS, its drain is connected to the input, and its source is connected to the source and gate of MP51 and the gate of MP54. The drain of MP54 is connected to the gate and source of a PMOS transistor MP53, its source is connected to the VBGP power supply, and its gate is connected to the gate and source of MP51 and the source of MP52. Regarding MP53, its gate and source are interconnected, the interconnected line is further connected to the drain of MP54 and the source of a PMOS transistor MP55, and its drain is connected to the VSS. The source of MP55 is connected to the drain of MP54 and the source and drain of MP53, its drain is connected to the output and the drain of an NMOS transistor MN55, and its gate is connected to the VSS. Regarding an NMOS transistor MN51, its source and drain are interconnected, the interconnected line is further connected to the source of an NMOS transistor MN52 and the gate of an NMOS transistor MN54, and its drain is connected to the VDD power supply and the gate of MN52. The drain of MN52 is connected to the input and the drain of MP52, its gate is connected to the drain of MN51 and the VDD power supply, and its source is connected to the date and the source of MN51 and the gate of MN54. The source of an NMOS transistor MN53 is connected to the gate and the drain of MN54 and the source of MN55. The drain of MN53 is connected to the gate of MN53 and the VDD power supply. The source of MN54 is connected to the VBGN power supply, its gate is connected to the source and gate of MN51 and the source of MN52, and its drain is connected to the source and gate of MN53 and the source of MN55. The gate of MN55 is connected to the drain of MN53 and the VDD power supply. The source of MN55 is connected to the gate and source of MN53 and the drain of MN54, and its drain is connected to the output OUT and the drain of MP55.

The substrate potential of each of the MOS transistors is described next. The substrate potentials of MP51 and MP52 equal to the source potential of MP51, and the substrate potentials of MP53 and MP55 equal to the substrate potential of MP53. The substrate potential of MP54 is VBGP. The substrate potentials of MN51 and MN52 equal to the source potential of MN51, and the substrate potentials of MN53 and MN55 equal to the source potential of MN53. The substrate potential of MN54 is VBGN.

Figure 15:
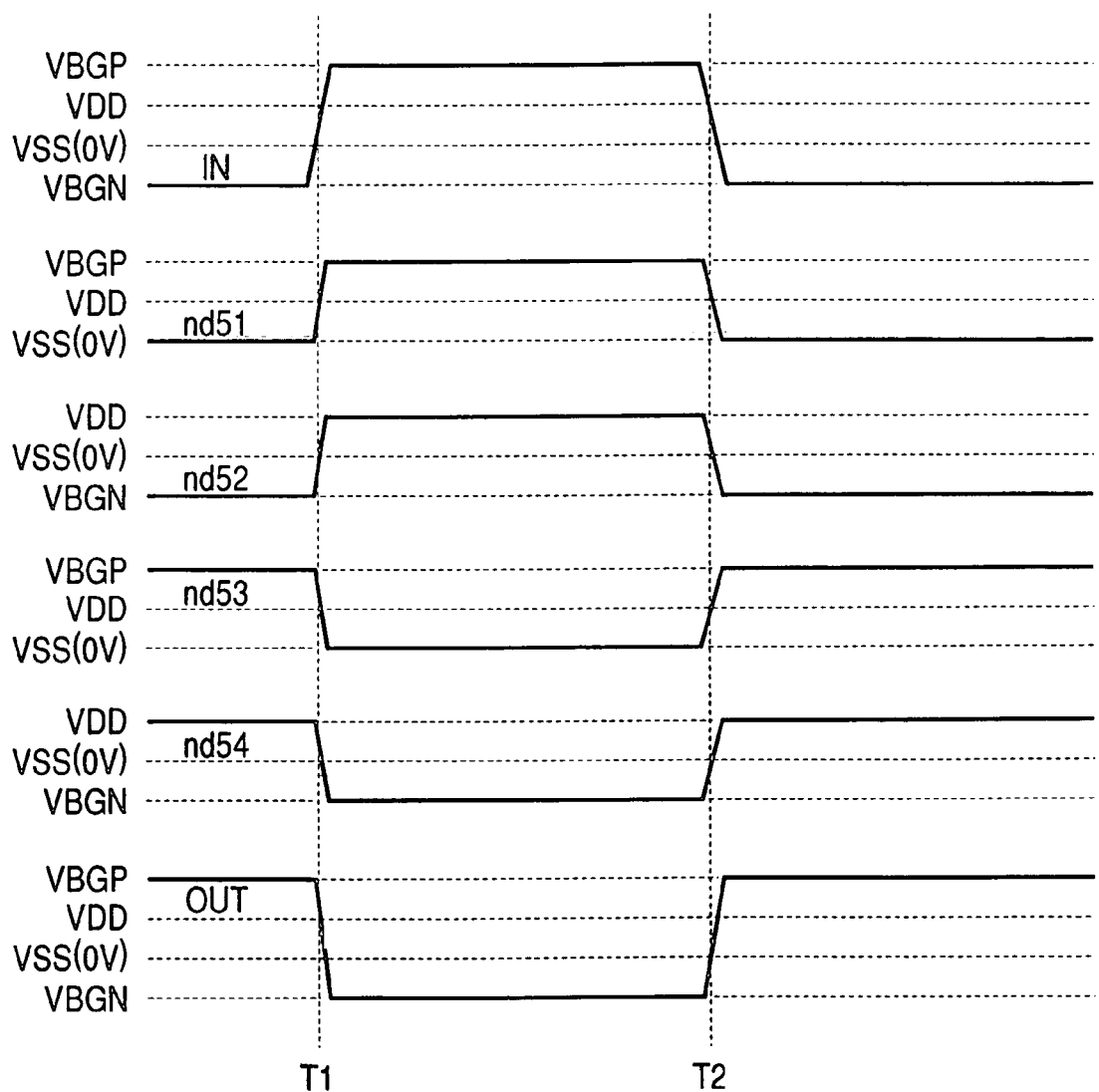
FIG. 15 shows the operating waveforms at major nodes of the level converter circuit shown in FIG. 14.

FIG. 15 shows the operating waveforms at each node of the inverter shown in FIG. 14. The input signal IN is a large-amplitude signal ranging between VBGP and VBGN. First, the operations when the input signal IN changes from the VBGN level to the VBGP level at time T1 is described. At this time, MP52 enters the OFF state, accordingly the potential at the node nd51 changes to the VBGP level. When the potential at the node nd51 changes to the VBGP level, MP54 switches OFF. On the other hand, MN52 acts as a withstand-voltage-enhancement MOS transistor such that the potential at the node nd52 changes to the VDD level. MN51 is used as a diode to prevent the potential at the node nd52 from being boosted above the VDD level. When the potential at the node nd54 changes to the VBGN level, since the gate potential of MN55 is at the VDD level, MN55 switches ON. As a result, the potential at the output node OUT changes to the VBGN level. When the potential at the output node OUT changes to the VBGN level, MP55 acts as a withstand-voltage-enhancement MOS transistor such that the potential at the node nd53 changes to the VSS level. MP 53 is used to prevent the potential at the node nd53 from being reduced below the VSS level.

As described above, the maximum source-drain, drain-gate, and gate-source apply voltage to the MOS transistors in this embodiment is VBGP-VSS or VDD-VBGN. If VBGP=2VDD and VBGN=-VDD, the maximum apply voltage of each of the MOS transistors is within 2VDD. Therefore, the design with VDD=1.2 V and the maximum apply voltage=3.6 V achieves the maximum apply voltage smaller than the withstand voltage.

Next, the operations when the input signal IN changes from the VBGP level to the VBGN level at time T2 are described. At this time, MP52 enters the ON state, accordingly the potential at the node nd52 changes to the VBGP level. When the potential at the node nd52 changes to the VBGP level, MN54 switches OFF. On the other hand, MP52 serves as a withstand-voltage-enhancement MOS transistor such that the potential at the node nd51 changes to the VSS level. MP51 is used as a diode to prevent the potential at the node nd51 from being reduced below the VSS level. When the potential at the node nd51 changes to the VSS level, MP54 switches ON, and the potential at the node nd53 changes to the VBGP level. When the potential at the node nd53 changes to the VBGP level, since the gate of MP55 is at the VSS level, MP55 switches ON. As a result, the potential at the output node OUT changes to the VBGP level. When the potential at the output node OUT changes to the VBGP level, MN55 acts as a withstand-voltage-enhancement MOS transistor, and the potential at the node nd54 changes to the VDD level. MN53 is used to prevent the potential at the node nd54 from being boosted above the VDD level.

As described above, the maximum source-drain, drain-gate, and gate-source apply voltages for the MOS transistors in the circuit of this embodiment is VBGP-VSS or VDD-VBGN. If VBGP=2VDD and VBGN=-VDD, the maximum apply voltage of each of the MOS transistors is within 2VDD. Therefore, the design with VDD=1.2 V and the maximum apply voltage=3.6 V achieves the maximum apply voltage smaller than the withstand voltage. Therefore, this embodiment transmits a signal of higher amplitude than the withstand voltage of the employed MOS transistors thereby avoiding the manufacturing cost increase.

Sixth Embodiment

Figure 16:
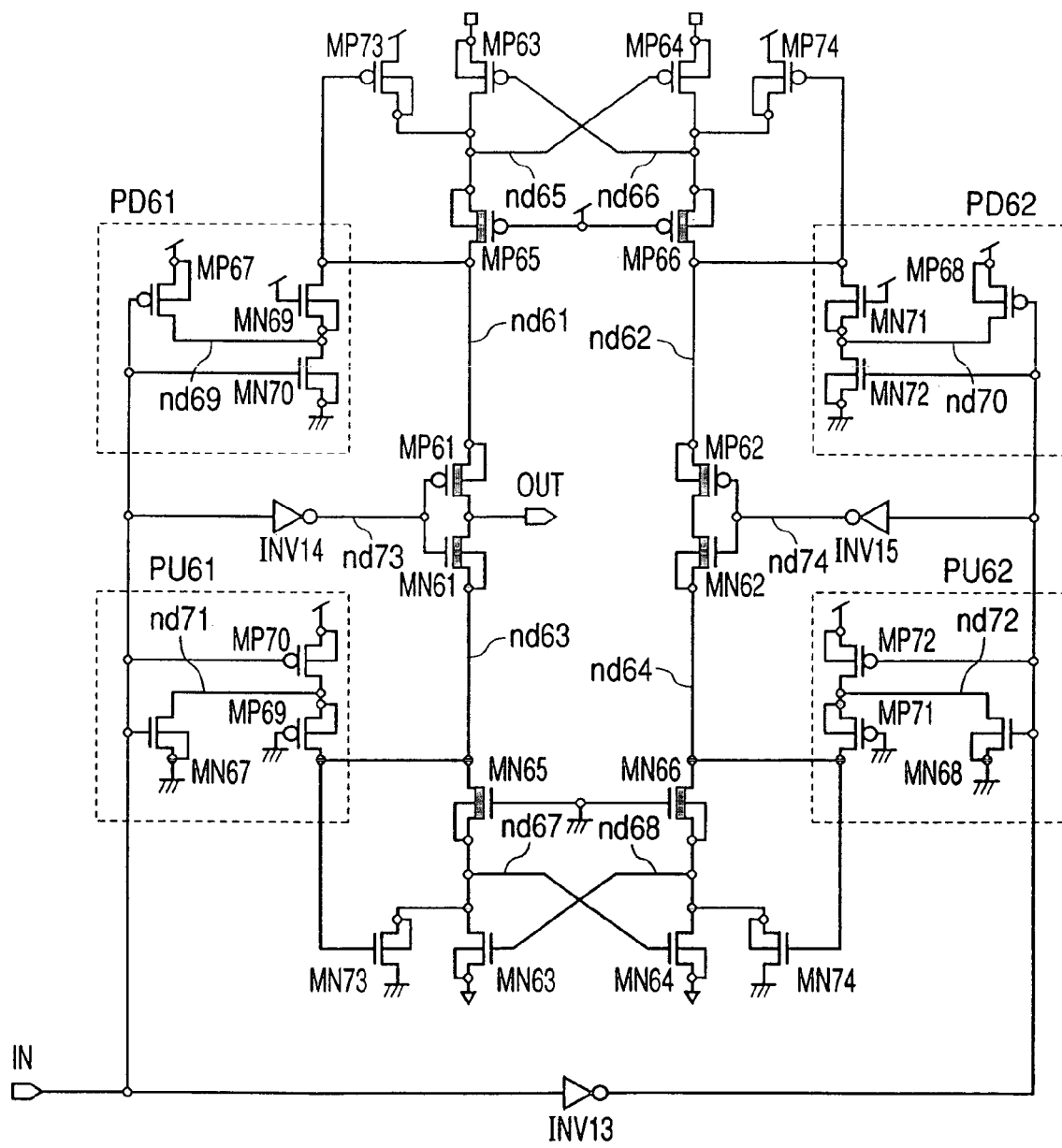
FIG. 16 shows one embodiment of a level converter circuit for converting a signal that varies between power supplies VDD and VSS to a signal that varies between power supplies VBGP and VBGN according to the present invention.

FIG. 16 shows an embodiment of a level converter circuit that converts a power supply signal ranging between the VSS and the VDD to a signal ranging between the VBGN and the VBGP. The level converter circuit of this embodiment is characterized by a configuration with thin-film MOS transistors all having a withstand voltage at the VDD level and a circuit configuration with symmetric arrangement of NMOS and PMOS transistors. Therefore, this embodiment can be used when the VBGP power supply voltage is twice the VDD voltage or less and the VBGN power supply voltage is -VDD voltage or more. The circuit of this embodiment includes pull-down circuits PD61 and PD62 (to the VSS level), pull-up circuits PU61 and PU62, a latch composed of PMOS transistors MP63, MP64, a latch composed of NMOS transistors MN63, MN64, a withstand-voltage-enhancement MOS transistor composed of PMOS transistors MP61, MP62, MP65, and MP66, a withstand-voltage-enhancement MOS transistor composed of NMOS transistors MN61, MN62, MN65, and MN66, a withstand-voltage-keeping MOS transistor composed of PMOS transistors MP73, MP74 and NMOS transistors MN73, MN74, and inverters INV13, INV14, and INV15.

The interconnection among these MOS transistors is described next. The pull-down circuit PD61 pulls the potential at the node nd61 down to the VSS level or causes the node nd61 to enter the high-resistance state in response to an input signal level. PD61 includes a PMOS transistor MP67 and NMOS transistors MN69, MN70. The source of MP67 is connected to the VDD power supply, its gate is connected to the input, and its drain is connected to the source of MN69 and the drain of MN70. The source of MN70 is connected to the VSS power supply, its gate is connected to the input, and its drain is connected to the drain of MN67 and the source of MN69. The source of MN69 is connected to the drains of MN70 and MN67, its gate is connected to the VDD power supply, and its drain is connected to the gate of the PMOS transistor MP73, the drain of the PMOS transistor MP65, and the source of the PMOS transistor MP61. The pull-down circuit PD62 pulls the potential at the node nd62 down to the VSS level, or causes the node nd62 to enter the high-resistance state. PD62 includes a PMOS transistor MP68 and NMOS transistors MN71 and MN72. The source of MP68 is connected to the VDD power supply, its gate is connected to the output of the inverter INV13, and its drain is connected to the source of MN71 and the drain of MN72. The source of MN70 is connected to the VSS power supply. The gate of MN72 is connected to the output of the inverter INV13, and the drain of MN72 is connected to the drain of MP68 and the source of MN71. The source of MN71 is connected to the drains of MN72 and MP68, its gate is connected to the VDD power supply, and its drain is connected to the gate of the PMOS transistor MP74, the drain of the PMOS transistor MP66, and the source of the PMOS transistor MP62. The pull-up circuit PU61 is used to pulls the potential at the node nd63 up to the VDD level, or causes the node nd63 to enter the high-resistance state in response to an input signal level of the level converter circuit. PU61 includes an NMOS transistor MN67 and PMOS transistors MP69 and MP70. The source of MP67 is connected to the VSS power supply, its gate is connected to the input, and its drain is connected to the source of MP69 and the drain of MP70. The source of MP70 is connected to the VDD power supply, its gate is connected to the input, and its drain is connected to the drain of MN67 and the source of MP69. The source of MP69 is connected to the drains of MP70 and MN67, its gate is connected to the VSS power supply, and its drain is connected to the gate of an NMOS transistor MN73, the drain of an NMOS transistor MN65, and the source of an NMOS transistor MN61. The pull-up circuit PU62 pulls the potential at the node nd64 up to the VDD level, or causes the node nd64 to enter the high-resistance state in response to an input signal level. PU62 includes an NMOS transistor MN68 and PMOS transistors MP71 and MP72. The source of MN68 is connected to the VSS power supply, its gate is connected to the output of the inverter INV13, and its drain is connected to the source of MP71 and the drain of MP72. The source of MN72 is connected to the VDD power supply, its gate is connected to the output of the inverter INV13, and its drain is connected to the drain of MN68 and the source of MP71. The source of MP71 is connected to the drains of MP72 and MN68, its gate is connected to the VSS power supply, and its drain is connected to the gate of the PMOS transistor MP74, the drain of the NMOS transistor MN66, and the source of the NMOS transistor MN62.

Regarding the NMOS transistor MN63, its source is connected to VBGN, its gate is connected to the drain of the NMOS transistor MN64 and the source of the NMOS transistor MN66, and its drain is connected to the sources of MN73 and the NMOS transistor MN65 and the gate of MN64. The source of MN64 is connected to VBGN, its gate is connected to the drain of MN63 and the source of MN65, and its drain is connected to the sources of MN74 and MN66 and the gate of MN63. The drain of MN73 is connected to the VSS power supply, its gate is connected to the drains of MN69 and MN65, and its source is connected to the drain of MN63 and the source of MN65. The drain of MN74 is connected to the VSS power supply, its gate is connected to the drains of MP71 and MN66, and its source is connected to the drain of MN64 and the source of MN66. The gate of MN65 is connected to the VSS power supply its source is connected to the drain of MN63 and the gate of MN64 and its drain is connected to the drain of MP69, the gate of MN73, and the source of the NMOS transistor MN61. The gate of MN66 is connected to the VSS power supply, its source is connected to the drain of MN64 and the gate of MN63, and its drain is connected to the drain of MN71, the gate of MN74, and the source of the NMOS transistor MN62. The gate of MN61 is connected to the output of the inverter INV14 and the gate of PMOS transistor MP61, its source is connected to the drains of MN65 and MP69, and the gate of MN73, and its drain is connected to the drain of MP61 and the output. The gate of MN62 is connected to the output of the inverter INV15 and the gate of the PMOS transistor MP62, its source is connected to the drains of MN66 and MP71 and the gate of MN74, and its drain is connected to the drain of MP62. Regarding the PMOS transistor MP63, its source is connected to VBGP, its gate is connected to the drain of the PMOS transistor MP64 and the source of the PMOS transistor MP66, and its drain is connected to the sources of MP73 and the PMOS transistor MP65, and the gate of MP64. The source of MP64 is connected to VBGP, its gate is connected to the drain of MP63 and the source of MP65, and its drain is connected to the sources of MP74 and MP66, and the gate of MP63. The drain of MP73 is connected to the VDD power supply, its gate is connected to the drains of MP69 and MP65, and its source is connected to the drain of MP63 and the source of MP65. The drain of MP74 is connected to the VDD power supply, its gate is connected to the drains of MN71 and MP66, and its source is connected to the drain of MP64 and the source of MP66. The gate of MP65 is connected to the VDD power supply, its source is connected to the drain of MP63 and the gate of MP64, and its drain is connected to the drain of MN69, the gate of MP73, and the source of MP61. The gate of MP66 is connected to the VDD power supply, its source is connected to the drain of MP64 and the gate of MP63, and its drain is connected to the drain of MN71, the gate of MP74, and the source of MP62. The gate of MP61 is connected to the output of the inverter INV14 and the gate of MN61, its source is connected to the drains of MP65 and MN69 and the gate of MP73, and its drain is connected to the drain of MN61 and the output. The gate of MP62 is connected to the output of the inverter INV15 ad the gate of MN62, its source is connected to the drains of MP66 and MN71 and the gate of MP74, and its drain is connected to the drain of MN62. The inverter INV15 is connected to the output of the inverter INV13, and the input of the inverter INV13 is connected to the input IN.

The substrate potential of each of these MOS circuits is described below. The substrate potentials of MP63 and MP64 are VBGP. The substrate potentials of MP67, MP68, MP73, MP74, MP70, and MP72 are VDD. The substrate potentials of MN63 and MN64 are VBGN. The substrate potentials of MN67, MN68, MN73, MN74, MN70, and MN72 are VSS. The substrate potentials of MP61, MP62, MP65, MP66, MP69, MP71 equal to their respective source potentials. The substrate potentials of MN61, MN62, MN65, MN66, MN69, MN71 equal to their respective source potentials.

Although MP61, MP62, MP56, MP66, MN51, MN62, MN65, and MN66 may be composed of standard-threshold MOS transistors, they are preferred to be composed of low-threshold MOS transistors from the viewpoint of low voltage operation. It is also effective to compose only MP61, MN61, MP62, and MN62 with low-threshold MOS transistors. In this embodiment, one practical threshold voltage of a standard-threshold MOS is 0.35 V, and one practical threshold voltage of a low-threshold MOS is 0.25 V. It is also effective to substitute the aforementioned low-threshold MOS with a standard-threshold MOS having a shorter gate than that of the standard-threshold MOS. This is because shorter gate length effectively lowers the threshold voltage. This embodiment eliminates the need for MOS transistors other than standard-threshold MOS transistors thereby avoiding manufacturing cost increase.

Figure 17:
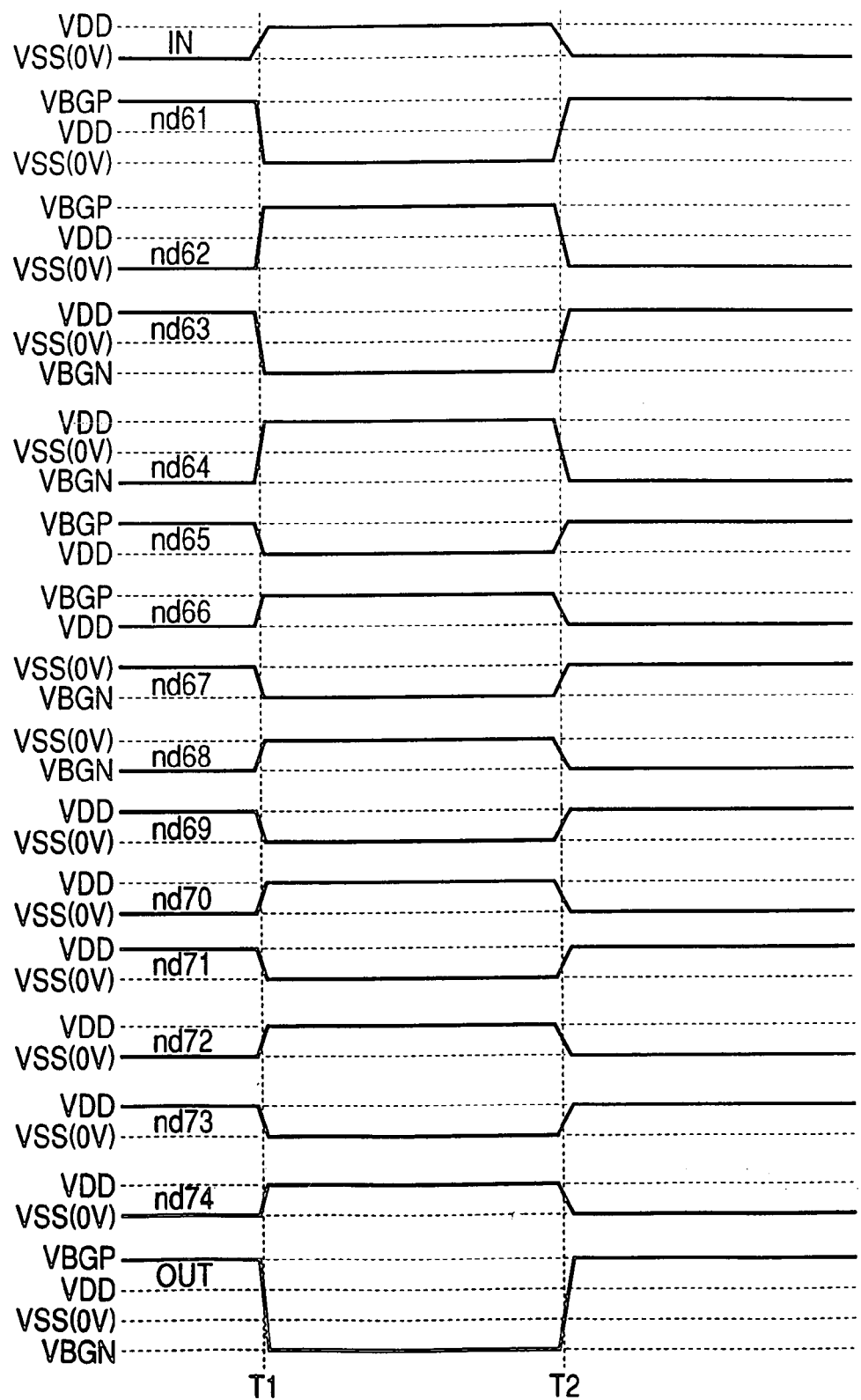
FIG. 17 shows the operating waveforms at major nodes of the level converter circuit shown in FIG. 16.

FIG. 17 shows the operating waveforms at each node of the embodiment shown in FIG. 16. First, the operations when the input IN changes from the VSS level to the VDD level is described. At this time, MP67 and MP70 switch OFF, and MN67 and MN70 switch ON such that the potentials at the nodes nd69 and nd71 change to the VSS level. Since the output of the inverter INV13 that receives the input IN changes to the VSS level, MN68 and MN72 switch OFF, and MP68 and MP71 switch ON. Thereafter, the potentials at the nodes nd70 and nd72 change to the VDD level. When the potential at the node nd72 changes to the VDD level, MP72 enters the state such that potential at the node nd64 changes to the VDD level. When the potential at the node nd64 changes to the VDD level, MN66 switches OFF and MN74 switches ON, and the potential at the node nd68 changes to the VSS level. When the potential at the node nd68 changes to the VSS level, MN63 switches ON, and the potential at the node nd67 changes to the VBGN level. When the potential at the node nd67 changes to the VBGN level, MN64 switches OFF, and the potential at the node nd68 is fixed to the VSS level. When the potential at the node nd67 changes to the VBGN level, since MN65 is in the ON state, the potential at the node nd63 changes to the VBGN level. At this time, MN69 enters the OFF state because both its source and gate potentials are at the VSS level and its drain is at the VBGN level MN73 also switches OFF because its source and gate potentials change to the VBGN level and its drain potential is at the VSS level. On the other hand, when the potential at the node nd69 in PD61 changes to the VSS level, MN69 enters the ON state and the potential at the node nd61 changes to the VSS level. When the potential at the node nd61 changes to the VSS level, MP73 switches ON such that the potential at the node nd65 changes to the VDD level. When the potential at the node nd65 changes to the VDD level, MP64 switches ON, and the potential at the node nd66 change to the VBGP level. At this time, since the potential at the node nd70 in PD62 is at the VDD level, MN71 enters the OFF state, and simultaneously the potential at the node nd62 changes to the VBGP level through MP66 in the ON state such that MP74 switches OFF. Therefore, the potential at the node nd66 is fixed to the VBGP level. When the potential at the node nd61 changes to the VSS level, the potential at the node nd62 changes to the VBGP level, the potential at the node nd63 changes to the VBGN level, and the potential at the node nd64 changes to the VDD level. The potential at the output node nd73 of the inverter INV14 is at the VSS level, while the potential at the output node nd74 of the inverter INV15 is at the VDD level. Accordingly, MP61 and MN62 switch OFF and MP62 and MN61 switch ON such that the output value changes to the VBGN level. The source-drain, source-gate, and gate-drain apply voltages of each of these MOS transistors are at the VDD level because VBGP is 2VDD and VBGN is −VDD. Therefore, the withstand voltage of a thin-film MOS is assured.

Next, the operations when the input IN changes from the VDD level to the VSS level are described. At this time, MP67 and MP70 switch ON, and MN67 and MN70 switch OFF such that the potentials at the nodes nd69 and nd71 change to the VDD level. Since the output of the inverter INV13 that receives the input IN changes to the VDD level, MN68 and MN72 switch ON, and MP68 and MP71 switch OFF. Therefore, the potentials at the nodes nd70 and nd72 change to the VSS level. When the potential at the node nd71 changes to the VDD level, MP69 enters the ON state such that the potential at the node nd63 changes to the VDD level. When the potential at the node nd63 changes to the VDD level, MN65 switches OFF and MN73 switches ON, and the potential at the node nd67 changes to the VSS level. When the potential at the node nd67 changes to the VSS level, MN64 switches ON, and the potential at the node nd68 changes to the VBGN level. When the potential at the node nd68 changes to the VBGN level, MN63 switches OFF, and the potential at the node nd67 is fixed to the VSS level. When the potential at the node nd68 changes to the VBGN level, since MN66 is in the ON state, the potential at the node nd64 changes to the VBGN level. At this time, MP72 enters the OFF state because its source and gate potentials are at the VSS level. When the potentials at both the nodes nd68 and nd64 changes to the VBGN level, MN74 switches OFF. On the other hand, when the potential at the node nd70 in PD62 changes to the VSS level, since MN71 is in the ON state, the potential at the node nd62 changes to the VSS level. When the potential at the node nd62 changes to the VSS level, since the gate potential of MP66 is at the VSS level, MP66 switches OFF and MP74 switches ON such that the potential at the node nd66 changes to the VDD level. When the potential at the node nd66 changes to the VDD level, MP63 switches ON, and the potential at the node nd65 change to the VBGP level. At this time, since the potential at the node nd69 in PD61 is at the VDD level, MN69 enters the OFF state, and simultaneously the potential at the node nd61 changes to the VBGP level through MP65 in the ON state. As a result, MP73 switches OFF. Therefore, the potential at the node nd65 is fixed to the VBGP level. When the potential at the node nd66 changes to the VDD level, MN66 switches OFF such that the potential at the node nd62 is fixed to the VSS level. When the potential at the node nd61 changes to the VBGP level, the potential at the node nd62 changes to the VSS level, the potential at the node nd63 changes to the VDD level, and the potential at the node nd64 changes to the VBGN level. The potential at the output node nd73 of the inverter INV14 is at the VDD level, and the potential at the output node nd74 of the inverter INV15 is at the VSS level. Accordingly, MP61 and MN62 switch ON and MP62 and MN61 switch OFF such that the output value changes to the VBGN level. The source-drain, source-gate, and gate-drain apply voltage values of each of these MOS transistors are at the VDD level because VBGP is 2VDD and VBGN is −VDD. Therefore, the withstand voltage of a thin-film MOS is assured.

This embodiment is characterized by use of a circuit configuration only with low-withstand-voltage thin-film MOS transistors for level conversion to higher-amplitude signals. This embodiment allows the use of the same circuit configuration even if technology advances thereby eliminating the need for redesigning the circuit and reducing design time.

Seventh Embodiment

Figure 18:
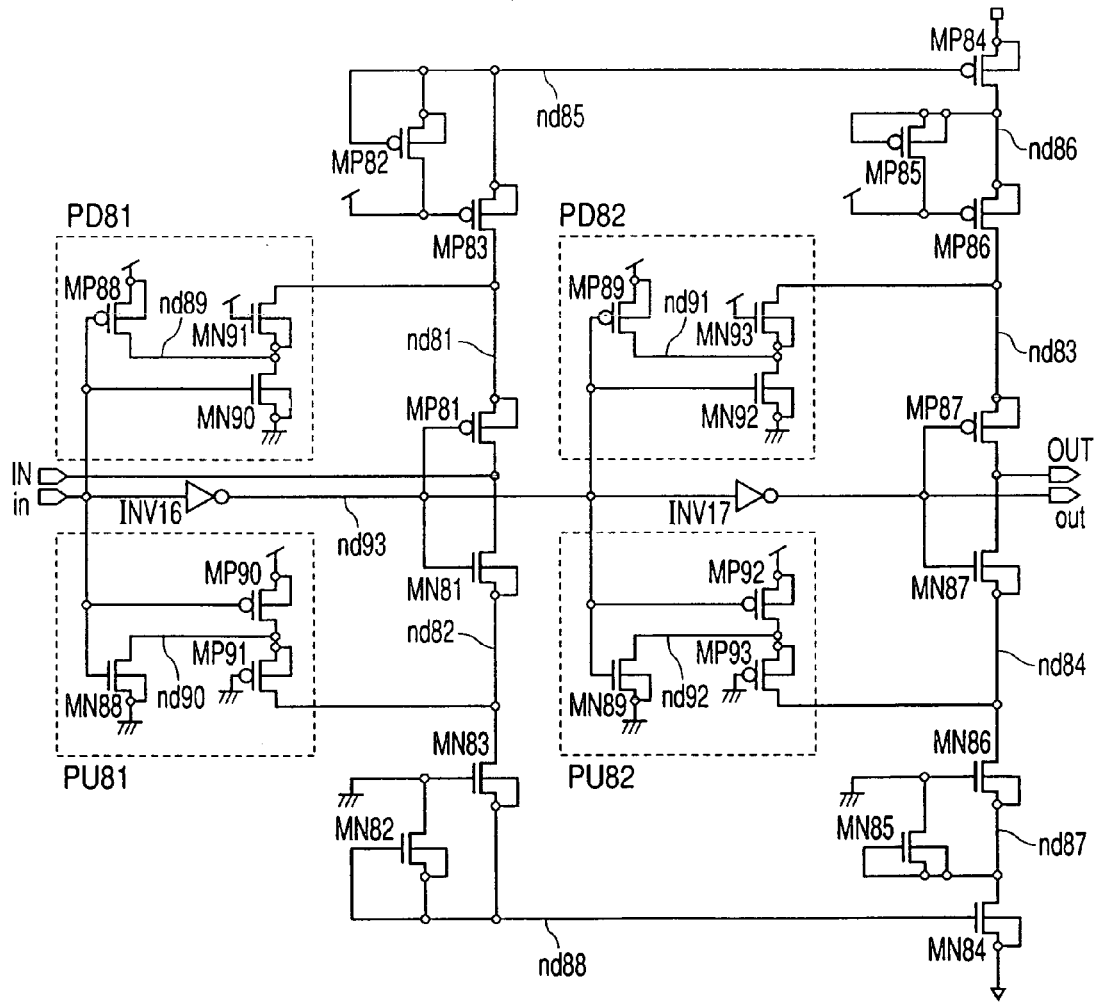
FIG. 18 shows another embodiment of an inverter that transmits a signal that varies between power supplies VBGP and VBGN according to the present invention.

FIG. 18 shows another embodiment of the inverter described with reference to FIG. 14. This embodiment is characterized by a circuit configuration only with thin-film MOS transistors. This allows the circuit of this embodiment to be used when the VBGP power supply voltage is twice the VDD voltage or less and the VBGN power supply voltage is −VDD or more. The circuit of this embodiment is a thin-film version of the circuit in FIG. 14. Implementing the thin-film version requires assuring of the withstand voltage at the VDD level so as to provide pull-down circuits PD81 and PD82, pull-up circuits PU81 and PU82, and inverters INV16 and INV17 for low-amplitude signals.

The interconnection among these MOS transistors is described below. The pull-down circuit PD81 includes a PMOS transistor MP88 and NMOS transistors MN90, MN91. The source of MP88 is connected to the VDD power supply, its gate is connected to a small-amplitude signal input "in", and its drain is connected to the source of MN91 and the drain of MN90. The source of MN90 is connected to the VSS power supply, its gate is connected to the small-amplitude signal input in, and its drain is connected to the drain of MP88 and the source of MN91. The source of MN91 is connected to the drains of MN90 and MP88, its gate is connected to the VDD power supply, and its drain is connected to the drain of a PMOS transistor MP83 and the source of PMOS transistor MP81. The pull-down circuit PD82 includes a PMOS transistor MP89 and NMOS transistors MN92 and MN93. The source of MP89 is connected to the VDD power supply, its gate is connected to the output of the inverter INV16 that receives a small-amplitude signal, and its drain is connected to the source of MN93 and the drain of MN92. The source of MN92 is connected to the VSS power supply, its gate is connected to the output of the inverter INV16 that receives a small-amplitude signal, and its drain is connected to the drain of MP89 and the source of MN93. The source of MN93 is connected to the drains of MN92 and MP89, its gate is connected to the VDD power supply, and its drain is connected to the drain of a PMOS transistor MP86 and the source of a PMOS transistor MP87. The pull-up circuit PU81 includes an NMOS transistor MN88 and PMOS transistors MP90, MP91. The source of MN88 is connected to the VSS power supply, its gate is connected to the small-amplitude signal input in, and its drain is connected to the source of MP91 and the drain of MP90. The source of MP90 is connected to the VDD power supply, its gate is connected to the small-amplitude signal input in, and its drain is connected to the drain of MN88 and the source of MP91. The source of MP91 is connected to the drains of MP90 and MN88, its gate is connected to the VSS power supply, and its drain is connected to the drain of an NMOS transistor MN82 and the source of an NMOS transistor MN81. The pull-up circuit PU82 includes an NMOS transistor MN89 and PMOS transistors MP92 and MP93. The source of MN89 is connected to the VSS power supply its gate is connected to the output of the inverter INV16 that receives the small-amplitude signal, and its drain is connected to the source of MP93 and the drain of MP92. The source of MP92 is connected to the VDD power supply, its gate is connected to the output of the inverter INV16 that receives the small-amplitude signal, and its drain is connected to the drain of MN89 and the source of MP93. The source of MP93 is connected to the drains of MP92 and MN89, its gate is connected to the VSS power supply, and its drain is connected to the drain of an NMOS transistor MN86 and the source of an NMOS transistor MN87.

Regarding a PMOS transistor MP82, its gate and source are interconnected, and the interconnected line is connected to the source of a PMOS transistor MP83 and the gate of a PMOS transistor MP84. The drain of MP82 is connected to the gate of MP83 and the VDD power supply. The gate of MP83 is connected to the drain of MP82 and the VDD power supply, its source is connected to the gate and source of MP82 and the gate of MP84. The drain of MP83 is connected to the drain of MN 91 and the source of PMOS transistor MP81. The gate of MP81 is connected to the gate of MN81 and the output of INV16, and its drain is connected to the drain of MN81 and the large-amplitude signal IN. The source of MP84 is connected to the VBGP power supply, its gate is connected to the gate and source of MP82 and the source of MP83, and its drain is connected to the source and gate of a PMOS transistor MP85 and the source of a PMOS transistor MP86. Regarding MP85, its gate and source is interconnected, and the interconnected line is connected to the drain of MP84 and the source of MP86. The source of MP86 is connected to the drain of MP84 and the gate and source of MP85, its gate is connected to the drain of MP85 and the VDD power supply, and its drain is connected to the drain of MN93 and the source of MP87. The gate of MP87 is connected to the gate of MN87 and the output of the INV17, its drain is connected to the drain of MN87 and the output OUT, and its source is connected to the drains of MN93 and MP86.

Regarding an NMOS transistor MN82, its gate and source are interconnected, and the interconnected line is connected to the source of an NMOS transistor MN83 and the gate of an NMOS transistor MN84, and its drain is connected to the gate of MN83 and the VSS power supply. The gate of MN83 is connected to the drain of MN82 and the VSS power supply, its source is connected to the gate and source of MN82 and the gate of MN84, and its drain is connected to the drain of MP91 and the source of MN81. The gate of MN81 is connected to the gate of MP81 and the output of INV16, and its drain is connected to the drain of MP81 and the large-amplitude signal IN. The source of MN84 is connected to the VBGN power supply, its gate is connected to the gate and source of MN82 and the source of MN83, and its drain is connected to the source and gate of an NMOS transistor MN85 and the source of an NMOS transistor MP86. Regarding MN85, its gate and source are interconnected, and the interconnected line is connected to the drain of MN84 and the source of MN86. The source of MN86 is connected to the drain of MN84 and the gate and source of MN85, its gate is connected to the drain of MN85 and the VSS power supply, and its drain is connected to the drain of MP93 and the source of MN87. The gate of MN87 is connected to the gate of MP87 and the output of INV17, its drain is connected to the drain of MP87 and the output OUT, and its source is connected to the drains of MP93 and MN86.

The substrate potential of each of these MOS transistors is described next. The substrate potential of MP81 equals to its source potential, the substrate potentials of MP83 and MP82 equal to the source potential of MP82, the substrate potential of MP84 equals to the VBGP potential, and the substrate potentials of MP85 and MP86 equal to the source potential of MP85. The substrate potential of MP87 equals to its source potential, the substrate potential of MP91 equals to its source potential, the substrate potential of MP93 equals to its source potential, and the substrate potentials of MP88, MP89, MP90, and MP92 equal to the VDD potential.

The substrate potential of MN81 equals to its source potential, the substrate potentials of MN83 and MN82 equal to the source potential of MN82, the substrate potential of MN84 equals to the VBGN potential, and the substrate potentials of MN85 and MN86 equal to the source potential of MN85. The substrate potential of MN87 equals to its source potential, the substrate potential of MN91 equals to its source potential, the substrate potential of MN93 equals to its source potential, and the substrate potentials of MN88, MN89, MN90, and MN92 equal to the VSS potential.

Although MP81, MP83, MP86, MP87, MN81, MN83, MN86, and MN87 may be composed of standard-threshold MOS transistors, it is more effective for them to be composed of low-threshold MOS transistors from the viewpoint of smaller voltage operations. Composing only MP81, MN81, MP87, and MN87 with low-threshold MOS transistors is also effective. In this embodiment, one actual threshold voltage of a standard-threshold MOS transistor is 0.35 V, and one actual threshold voltage of a low-threshold MOS transistor is 0.25 V. It is also effective to substitute a standard-threshold MOS transistor with a gate shorter than that of a standard-threshold MOS transistor for the low-threshold MOS transistor. This is because shorter gate length effectively reduces the threshold voltage. This embodiment uses only standard-threshold MOS transistors so as to avoid manufacturing cost increase.

Figure 19:
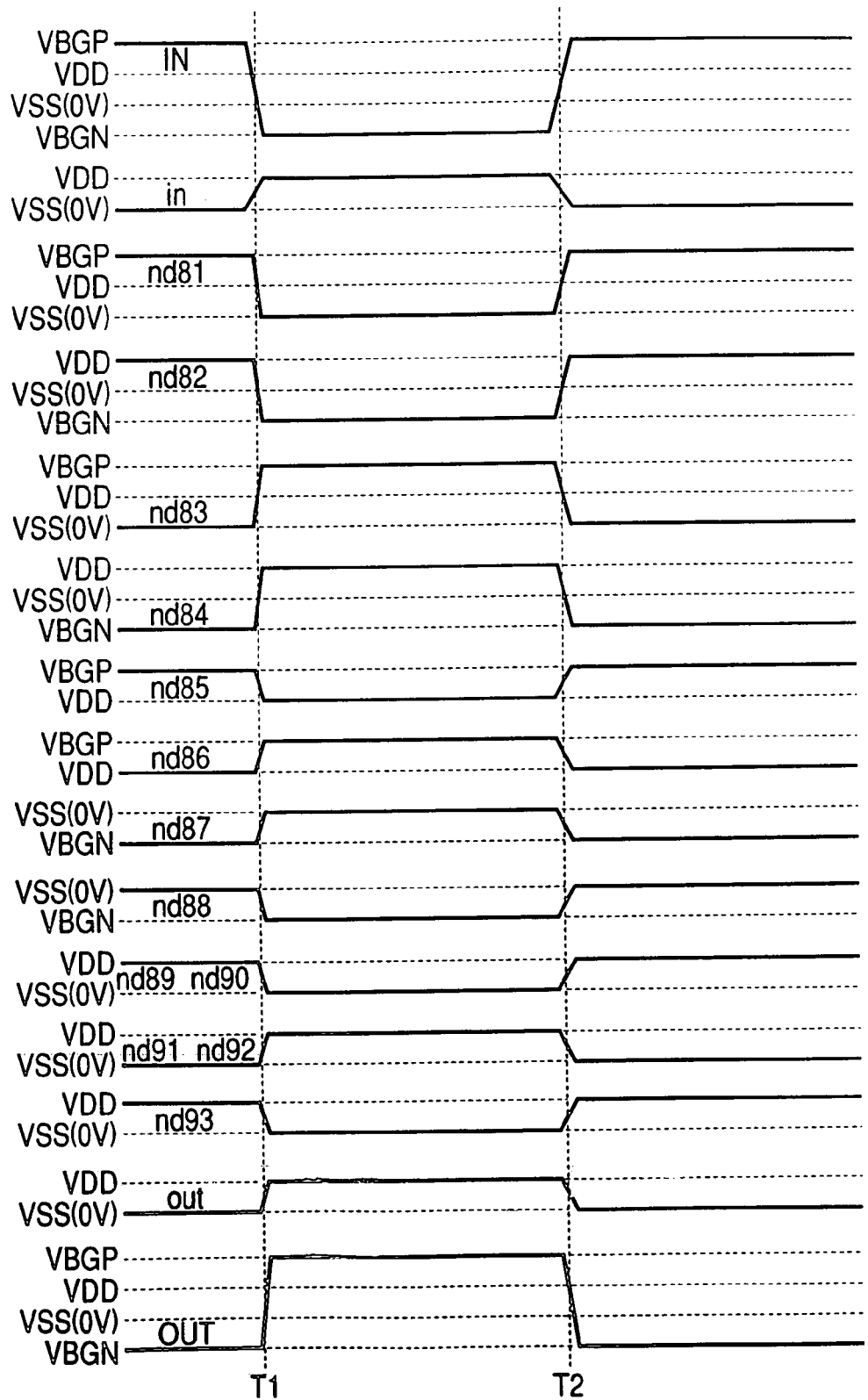
FIG. 19 shows the operating waveforms at major nodes of the level converter circuit shown in FIG. 18.

FIG. 19 shows the operating waveforms at each node of the embodiment shown in FIG. 18. This circuit imposes restriction on the combination of the high and low levels of the large-amplitude signal IN and the small-amplitude signal "in". The embodiment shown in FIG. 18 requires this restriction in order to suppress the maximum apply voltage of thin-film MOS transistors (constituting the inverter circuit) to the VDD level. First, the operations when the small-amplitude input signal "in" is at the VSS level and the large-amplitude input signal IN is at the VBGP level is described. At this time, in PD81, MP88 switches ON and MN90 switches OFF such that the potential at the node nd89 changes to the VDD level. At the same time, in PU81, MN88 switches OFF and MP90 switches OFF such that the potential at the node nd90 changes to the VDD level. When the potential at the node nd90 changes to the VDD level, since MP91 is in the ON state, the potential at the node nd82 changes to the VDD level. At this time, the potential at the output node nd93 of INV16 is at the VDD level and the large-amplitude input signal IN is at the VBGP level such that MN81 switches OFF and MP81 switches ON. As a result, the potential at the node nd81 changes to the VBGP level. At this time, MP83 also enters the ON state because its gate voltage is at the VDD level, and the potential at the node nd85 changes to the VBGP level. When the potential at the node nd85 changes to the VBGP level, MP84 switches OFF. On the other hand, when the potential at the node nd82 changes to the VDD level, MN82 switches OFF and the potential at the node nd88 changes to the VSS level according to MN83. When the potential at the node nd88 changes to the VSS level, MN84 switches ON and the potential at the node nd87 changes to the VBGN level. When the potential at the node nd87 changes to the VBGN level, MN86 switches ON and the potential at the node nd84 changes to the VBGN level. In addition, in PD82, the potential at the output node nd93 of INV16 is at the VDD level such that MP89 switches OFF and MN92 switches ON. Therefore, the potential at the node nd91 changes to the VSS level. When the potential at the node nd91 changes to the VSS level, MN93 switches ON such that the potential at the node nd83 changes to the VSS level. At the same time, in PU82, the potential at the output node nd93 is at the VDD level such that MP92 switches OFF and MN89 switches ON. As a result, the potential at the node nd92 changes to the VSS level. When the potential at the node nd92 changes to the VSS level, MP93 switches OFF. Since the potential at the node nd83 is at the VSS level, MP86 is in the OFF state, the potential at the node nd86 changes to the VDD level in response to MP85. At this time, the potential at the output node nd94 of INV17 is at the VSS level such that MN87 switches ON and the potential at the output node OUT changes to the VBGN level, and MP87 switches OFF.

Next, the operations when the small-amplitude input signal "in" is at the VDD level and the large-amplitude input signal IN is at the VBGN level are described. At this time, in PD81, MP88 switches OFF and MN90 switches ON such that the potential at the node nd89 changes to the VSS level. When the potential at the node nd89 changes to the VSS level, since MN91 is in the ON state, the potential at the node nd81 changes to the VSS level. At the same time, in PU81, MN88 switches ON and MP90 switches OFF such that the potential at the node nd90 changes to the VSS level. In PD82, the potential at the output node nd93 of INV16 is at the VSS level such that MP89 switches ON and MN92 switches OFF. Therefore, the potential at the node nd91 changes to the VDD level. At the same time, in PU82, the potential at the node nd93 is at the VSS level such that MP92 switches ON and MN89 switches OFF. Therefore, the potential at the node nd92 changes to the VDD level. When the potential at the node nd92 changes to the VDD level, MN93 switches ON such that the potential at the node nd84 changes to the VDD level. At this time, the potential at the output node nd93 of INV16 is at the VSS level and the large-amplitude input signal IN is at the VBGN level such that MN81 switches ON and MP81 switches OFF. As a result, the potential at the node nd82 changes to the VBGN level. At this time, since MN83 is in the ON state, the potential at the node nd88 also changes to the VBGN level. When the potential at the node nd88 changes to the VBGN level, MN84 switches OFF. Since the potential at the node nd84 is at the VSS level, MN86 is in the OFF state, and the potential at the node nd87 changes to the VSS level through MN85. On the other hand, when the potential at the node nd81 changes to the VSS level, MP83 switches OFF and the potential at the node nd85 changes to the VDD level according to MP82. When the potential at the node nd85 changes to the VDD level, MP84 switches ON and the potential at the node nd86 changes to the VBGP level. When the potential at the node nd86 changes to the VBGP level, MP86 switches ON and the potential at the node nd83 changes to the VBGP level. At this time, since the potential at the output node nd94 of INV17 is at the VDD level, MP87 switches ON and the potential at the output node OUT changes to the VBGP level, and MN87 switches OFF.

In this embodiment, the maximum source-drain, drain-gate, and gate-source voltages of all MOS transistors are VDD. Therefore, the component MOS transistors may be low-withstand-voltage (thin-film) MOS transistors in spite of handling high-amplitude signals. Since a thin-film MOS transistor operates at high speed even with low voltages, this embodiment allows operation at low voltages. Therefore, this embodiment is characterized by the use of a circuit configuration only having low-withstand-voltage (thin-film) MOS transistors for level conversion to a high-amplitude signal. Therefore, this embodiment allows the use of the same circuit even if the technology advances thereby eliminating the need for redesigning the circuit and reducing the design time.

This embodiment enables fast level conversion of a low input power supply voltage by configuring the level shifting circuit with MOS transistors having two types of oxide film thicknesses and using a low-threshold MOS transistor as the withstand-voltage-enhancement MOS transistor for enhancing apply voltages to the thin-film MOS transistors with smaller withstand voltages. In addition, this embodiment provides a gate boosting circuit for boosting the potential at the gate of the withstand-voltage-enhancement MOS transistor during the of level conversion thereby fast level converting a signal with a smaller amplitude. Furthermore, the level transition detector TD detects the first falling edge of the differential output pair of the level converter circuit and transmits information that logic conversion has been made to the following stage, thus enabling faster signal transmission.

Eighth Embodiment

Figure 20:
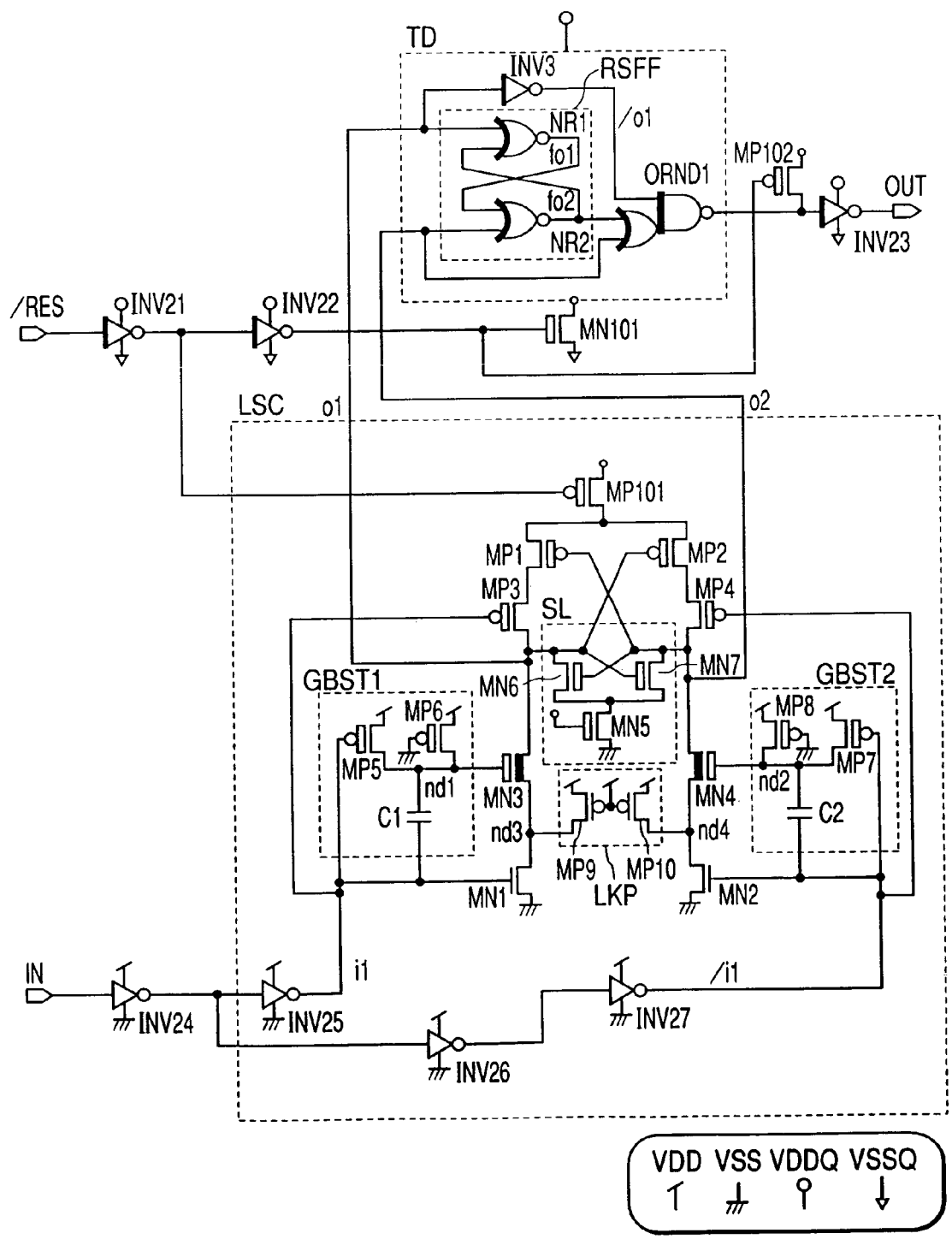
FIG. 20 shows a modified embodiment of the first embodiment of the present invention showing FIG. 1.

FIG. 20 is a drawing showing a modified embodiment of the first embodiment of the present invention showing FIG. 1.

The feature of this embodiment has power switches which avoid the penetration current when the input-side circuit powers down.

The difference between FIG. 1 and FIG. 20 is described as follows. It has a PMOS power switch MP101 for the level shifting circuit and a NMOS power switch MN101 for the level transition detector TD, instead of the reset circuit RSC of FIG. 1. And, it has a level keeping PMOS MP102 for fixing the output level of the level transition detector TD at a reset state.

Also, this embodiment shows a method for driving the capacitor C1 and C2 identically by connecting inverters INV25 and INV27 to node i1, /i1 respectively. This has an advantage for using a low voltage. This method is applicable not only this embodiment but also aforementioned embodiments of FIGS. 1, 4 and 16.

Furthermore, the ground-level (VSS, VSSQ) connections of this embodiment is different from those of FIG. 1. The ground level of the level transition detector of this embodiment is VSS whose corresponding positive power line is VDDQ. In other words, two separate ground levels VSS, VSSQ are connected to the level shift circuit and the level transition circuit. Since the complementary outputs form differential signals, the high noise immunity can be achieved with noisy VSSQ. This method applies not only this embodiment but also aforementioned embodiments of FIG. 1 and FIG. 4. Other structures of this embodiment are identical to the corresponding structures of aforementioned embodiment of FIG. 1.

The control of the reset signal is described below. When the reset signal is HI, since MP101 and MN101 are both in ON state, and MP102 is OFF state, the level shift circuit LSC and the signal transition detector TD function as in the embodiment of FIG. 1 in the case of HI of /RES. On the other hand, when the reset signal /RES is LOW, MP101 and MN101 are both in OFF state, and MP102 is in ON state, the output signal is fixed at "LOW" level. Since the level shift circuit and the signal transition detector are powered off by the switch MOSs, there is no penetration current in the LSC and the TD, even if the input signal is an intermediate value between VDD and VSS when VDD powers off.

The advantage of having a PMOS switch for the level shift circuit LSC is now described. The main advantage of PMOS switch is to save layout area. The level shift circuit needs NMOS, which needs large layout area (compared with PMOS). Also, if an NMOS switch is built in the LSC, the internal node of the level shift circuit will move to VDDQ level by leakage current when VDD powers off. When VDD-powers off, the internal node of the level shift circuit never charges up beyond VDDQ by using a PMOS switch. As such, the PMOS switch is indispensable for guarantee the withstand voltage when VDD powers off.

The NMOS switch of the TD guarantees that the output signal is at a low level when the reset signal is at a low level. If the output signal fixes at a HI level by the reset signal, the power switch for the TD changes the PMOS switch and pulls down the NMOS connecting to the MP102.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A semiconductor device including a differential level converter circuit that receives a first signal and a phase-inverted signal of the first signal and outputs a second signal of a larger amplitude than an amplitude of the first signal,
wherein the differential level converter circuit comprises a first MISFET pair of a first conductivity type for receiving the first signal and the phase-inverted signal; of the first signal; a second MISFET pair of the first conductivity type for improving a withstand voltage of the first MISFET pair; a third MISFET pair of a second conductivity type having cross-coupled gates for latching the second signal to output; and a forth MISFET pair of the second conductivity type for ensuring the withstand voltage of the first MISFET pair;
wherein a film thickness of gate insulating films of the second MISFET pair is thicker than a film thickness of gate insulating films of the first MISFET pair;
wherein a film thickness of gate insulating films of the third MISFET pair is thicker than the film thickness of the gate insulating films of the first MISFET pair;
wherein an absolute value of a threshold voltage of the second MISFET pair is smaller than an absolute value of a threshold voltage of the third MISFET pair;
wherein an absolute value of a threshold voltage of the first MISFET pair is smaller than the absolute value of the threshold voltage of the third MISFET pair;
wherein a drain of one of the fourth MISFET pair is coupled to a drain of one of the first MISFET pair, and the first signal is inputted to a gate of the one of the fourth MISFET pair; and
wherein a drain of another of the fourth MISFET pair is coupled to a drain of another of the first MISFET pair, and the phase-inverted signal of the first signal is inputted to a gate of the another of the fourth MISFET pair.

2. The semiconductor device according to claim 1, wherein the film thickness of gate insulating films of the second MISFET pair is thicker than a film thickness of gate insulating films of the fourth MISFET pair;
wherein a film thickness of gate insulating films of the third MISFET pair is thicker than the film thickness of the gate insulating films of the fourth MISFET pair;
wherein an absolute value of a threshold voltage of the fourth MISFET pair is smaller than the absolute value of the threshold voltage of the third MISFET pair.

3. The semiconductor device according to claim 2, wherein the gate insulating films of the second MISFET pair and the third MISFET pair are formed in one process and the insulating films of the first MISFET pair and the fourth MISFET pair are formed in another process.

4. The semiconductor device according to claim 1, wherein a source-drain path of one MISFET of the each of the first to third MISFET pairs is connected in series and a source-drain path of the other MISFET of each of the first to third MISFET pairs is also connected in series, such that the second MISFET pair is arranged between the first MISFET pair and the third MISFET pair.

5. The semiconductor device according to claim 1, wherein the gate insulating films of the first MISFET pair are made of a material with a dielectric constant higher than the dielectric constant of silicon dioxide.

6. The semiconductor device according to claim 1, wherein the differential level converter circuit outputs a first differential output from one drain of the third MISFET pair and a second differential output from the other drain of the third MISFET pair, and the semiconductor device further includes a level transition detector that detects and outputs a first in-time edge transition of one of the first differential output and the second differential output.

7. The semiconductor device according to claim 6, wherein the level transition detector includes an RS flip-flop, an inverter, an OR gate, and a NAND gate, the first differential output is input to a first input node of the RS flip-flop and the inverter, the second differential output is input to a second input node of the RS flip-flop and a first input node of the OR gate, an output of the RS flip-flop is input to a second input node of the OR gate, and an output of the OR gate and an output of the inverter are input to the NAND gate.

8. The semiconductor device according to claim 6, wherein the level transition detector includes an RS flip-flop, a NAND gate, and a D flip-flop, the first differential output is input to a first input node of the RS flip-flop, the second differential output is input to a second input node of the RS flip-flop, a phase-inverted signal of the first differential input, is input to a first input node of the NAND gate, a phase-inverted signal of the second differential input is input to a second input node of the NAND gate, an output of the NAND gate is input to the D flip-flop as a clock; and an output of the RS flip-flop is input to the D flip-flop as data.

9. The semiconductor device according to claim 1, wherein the first MISFET pair and the second MISFET pair are N-channel MISFETs, and the third MISFET pair and the fourth MISFET pairs are P-channel MISFETS.

10. A semiconductor device including a level converter circuit that receives a first signal with an amplitude of a first voltage and outputs a second signal with an amplitude of a second voltage which is larger than the first voltage,
wherein the level converter circuit comprises a first MISFET, a second MISFET and a third MISFET with source-drain paths therein connected in series having the second voltage applying therebetween; a fourth MISFET, a fifth MISFET and a sixth MISFET with source-drain paths therein connected in series having the second voltage applying therebetween; a seventh MISFET with a source-drain path
between a drain of the first MISFET and the first voltage, and a eighth MISFET with a source-drain path between a drain of the fourth MISFET and the first voltage,
wherein the first, second, fourth and fifth MISFETs are a first conductivity type and the third, sixth, seventh and eights MISFETs are a second conductivity type,
wherein the first, second and seventh MISFETS receive the first signal at gates therein; the fourth, fifth and eighth MISFETs receive a phase-inverted signal of the first signal at gates therein,
wherein a gate of the third MISFET is coupled to a drain of the sixth MISFET; a gate of the sixth MISFET is coupled to a drain of the third MISFET,
wherein each of the second, third, fifth and sixth MISFETs has a gate insulating film thicker than the gate insulating film of each of the first, fourth, seventh and eighth MISFETs; and each of the second and fifth MISFETs has a threshold voltage lower than a threshold voltage of each of the first, third, fourth and sixth MISFETS.

11. The semiconductor device according to claim 10, wherein the gate insulating film of each of the first, fourth, seventh and eighth MISFETs is formed in one manufacturing process; and the gate insulating film of each of the second, third, fourth and fifth MISFETS is formed in another manufacturing process.

12. The semiconductor device according to claim 10, wherein the differential level converter circuit outputs a first differential output from a drain of the third MISFET and a second differential output from a drain of the sixth MISFET, and the semiconductor device further includes a level transition detector that detects and outputs a first-in-time edge transition of one of the first differential output and the second differential output.

13. The semiconductor device according to claim 12, wherein the level transition detector includes an RS flip-flop, an inverter, an OR gate, and a NAND gate, the first differential output is input to a first input node of the RS flip-flop and the inverter, the second differential output is input to a second input node of the RS flip-flop and a first input node of the OR gate, an output of the RS flip-flop is input to a second input node of the OR gate, and an output of the OR gate and an output of the inverter are input to the NAND gate.

14. The semiconductor device according to claim 12, wherein the level transition detector includes an RS flip-flop, a NAND gate, and a D flip-flop, the first differential output is input to a first input node of the RS flip-flop, the second differential output is input to a second input node of the RS flip-flop, a phase-inverted signal of the first differential input is input to a first input node of the NAND gate, a phase-inverted signal of the second differential input is input to a second input node of the NAND gate, an output of the NAND gate is input to the D flip-flop as a clock; and an output of the RS flip-flop is input to the D flip-flop as data.

15. The semiconductor device according to claim 10, wherein the first conductivity type is N type and the second conductivity type is P type.

* * * * *